US009999157B2

(12) United States Patent
Chiriac et al.

(10) Patent No.: US 9,999,157 B2
(45) Date of Patent: Jun. 12, 2018

(54) MULTI-PHASE HEAT DISSIPATING DEVICE EMBEDDED IN AN ELECTRONIC DEVICE

(71) Applicant: QUALCOMM Incorporated, San Diego, CA (US)

(72) Inventors: Victor Chiriac, Phoenix, AZ (US); Jorge Rosales, San Diego, CA (US); Jon Anderson, Boulder, CO (US); Stephen Molloy, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/236,070

(22) Filed: Aug. 12, 2016

(65) Prior Publication Data

US 2018/0049346 A1    Feb. 15, 2018

(51) Int. Cl.
| | |
|---|---|
| *H05K 7/20* | (2006.01) |
| *G06F 1/20* | (2006.01) |
| *H01L 23/367* | (2006.01) |
| *H01L 23/427* | (2006.01) |
| *H01L 21/48* | (2006.01) |

(52) U.S. Cl.
CPC .......... *H05K 7/20309* (2013.01); *G06F 1/20* (2013.01); *H01L 21/4882* (2013.01); *H01L 23/3675* (2013.01); *H01L 23/427* (2013.01); *H05K 7/20318* (2013.01)

(58) Field of Classification Search
CPC ............. H05K 7/20309; H01L 23/427; H01L 23/4882
USPC ........................................................ 361/700
See application file for complete search history.

(56) References Cited

U.S. PATENT DOCUMENTS

| | | |
|---|---|---|
| 6,226,178 B1 | 5/2001 | Broder et al. |
| 6,674,642 B1 | 1/2004 | Chu et al. |
| 7,188,484 B2 | 3/2007 | Kim |
| | (Continued) | |

FOREIGN PATENT DOCUMENTS

| | | |
|---|---|---|
| EP | 2348271 A1 | 7/2011 |
| WO | WO-2007130668 A2 | 11/2007 |
| | (Continued) | |

OTHER PUBLICATIONS

International Search Report and Written Opinion—PCT/US2017/043253—ISA/EPO—Oct. 2, 2017.

*Primary Examiner* — Dion R Ferguson
*Assistant Examiner* — Mandeep S Buttar
(74) *Attorney, Agent, or Firm* — Loza & Loza, LLP/Qualcomm

(57) ABSTRACT

A device that includes a region comprising an integrated device and a heat dissipating device coupled to the region comprising the integrated device. The heat dissipating device is configured to dissipate heat away from the region. The heat dissipating device includes a fluid, an evaporator configured to evaporate the fluid, a first condenser configured to condense the fluid, where the first condenser is located in a first wall of the device, an evaporation portion coupled to the evaporator and the first condenser, and a collection portion coupled to the first condenser and the evaporator. The evaporation portion is configured to channel an evaporated fluid from the evaporator to the first condenser. The collection portion is configured to channel a condensed fluid from the first condenser to the evaporator through the help of gravity.

23 Claims, 24 Drawing Sheets

(56) References Cited

U.S. PATENT DOCUMENTS

| | | |
|---|---|---|
| 7,486,517 B2 | 2/2009 | Aapro et al. |
| 7,552,759 B2 | 6/2009 | Liu et al. |
| 8,716,689 B2 | 5/2014 | Chen et al. |
| 8,763,681 B2 | 7/2014 | Agostini et al. |
| 9,007,769 B2 | 4/2015 | Cheng et al. |
| 9,097,467 B2 | 8/2015 | Gradinger et al. |
| 9,261,309 B2 | 2/2016 | Wang |
| 2002/0170705 A1 | 11/2002 | Cho et al. |
| 2003/0079865 A1 | 5/2003 | Son et al. |
| 2003/0205364 A1 | 11/2003 | Sauciuc et al. |
| 2004/0190253 A1 | 9/2004 | Prasher et al. |
| 2005/0051304 A1 | 3/2005 | Makino et al. |
| 2005/0099776 A1 | 5/2005 | Xue et al. |
| 2007/0012427 A1* | 1/2007 | Liu ............... H01L 23/427 165/104.26 |
| 2007/0151275 A1* | 7/2007 | Chiriac ............ F25B 39/00 62/259.2 |
| 2011/0051071 A1* | 3/2011 | Nakamichi ........ G06F 1/1601 349/161 |
| 2011/0232874 A1 | 9/2011 | Xu et al. |
| 2011/0279978 A1 | 11/2011 | Yoshikawa et al. |
| 2012/0199322 A1* | 8/2012 | Frigiere ........... F28D 15/0275 165/104.21 |
| 2013/0270721 A1 | 10/2013 | Chiriac et al. |
| 2014/0352926 A1 | 12/2014 | Sun et al. |
| 2016/0037681 A1* | 2/2016 | Lee ................. H04B 1/036 455/556.1 |
| 2016/0076819 A1 | 3/2016 | Espersen et al. |
| 2017/0293329 A1 | 10/2017 | Chiriac et al. |
| 2017/0295671 A1 | 10/2017 | Chiriac et al. |

FOREIGN PATENT DOCUMENTS

| | | |
|---|---|---|
| WO | WO-2012161002 A1 | 11/2012 |
| WO | WO-2015142669 A1 | 9/2015 |
| WO | WO-2015154044 A1 | 10/2015 |

\* cited by examiner

THERMALLY CONDUCTIVE ELEMENT
CONFIGURED AS EVAPORATOR

MULTI-PHASE HEAT DISSIPATING DEVICE EMBEDDED IN AN ELECTRONIC DEVICE

BACKGROUND

Field

Various features relate a heat dissipating device, and more specifically to a multi-phase heat dissipating device embedded in an electronic device.

Background

Electronic devices include internal components that generate heat. Some of these internal components include a central processing unit (CPU), a graphics processing unit (GPU) and/or memory. Some of these internal components can generate a lot of heat. Specifically, a high performance CPU and/or GPU of an electronic device can generate a lot of heat, especially when performing data intensive operations (e.g., games, processing video).

To counter or dissipate the heat generated by the CPU and/or GPU, an electronic device may include a heat dissipating device, such as a heat spreader. FIGS. 1-3 illustrate an example of a mobile device that includes a heat spreader for dissipating heat generated by a chip. As shown in FIGS. 1 and 2, the mobile device 100 includes a display 102, a back side surface 200, a die 202, and a heat spreader 204. The die 202 and the heat spreader 204, which are both shown with dotted lines, are located inside the mobile device 100. The die 202 is coupled to a first surface of the heat spreader 204. A second surface of the heat spreader 204 is coupled to a first surface (e.g., inner surface) of the back side surface 200.

FIG. 3 illustrates a profile view of the mobile device 100 that includes the heat spreader 204. As shown in FIG. 3, the mobile device 100 includes the display 102, the back side surface 200, a front side surface 300, a bottom side surface 302, and a top side surface 304. FIG. 3 also illustrates a printed circuit board (PCB) 306, the die 202 and the heat spreader 204 inside the mobile device 100.

As further shown in FIG. 3, a first side of the die 202 is coupled to a first surface of the PCB 306. A second side of the die 202 is coupled to a first surface of the heat spreader 204. A second surface of the heat spreader 204 is coupled to a first surface (e.g., inner surface) of the back side surface 200. In this configuration, a lot of the heat that is generated by the die 202 is dissipated through the heat spreader 204 and the back side surface 200 of the mobile device. However, the heat spreader 204 has limitation, including its limited heat dissipating capabilities. For example, the heat spreader 204 implemented in a mobile device, may be limited to dissipate away about 3 Watts of heat (depending of the configuration of the heat spreader 204).

Therefore, there is a need for an improved method and design for efficiently dissipating heat from an electronic device (e.g., mobile device), while at the same time keeping the temperature of the outer surface of the electronic device within a threshold that is acceptable to a user of the electronic device. In addition, there is a need for reducing the junction temperature of heat generating region.

SUMMARY

Various features relate a heat dissipating device, and more specifically to a multi-phase heat dissipating device for an electronic device.

An example provides a device that includes a region comprising an integrated device and a heat dissipating device coupled to the region comprising the integrated device. The heat dissipating device is configured to dissipate heat away from the region. The heat dissipating device includes a fluid, an evaporator configured to evaporate the fluid, a first condenser configured to condense the fluid, where the first condenser is located in a first wall of the device, an evaporation portion coupled to the evaporator and the first condenser, and a collection portion coupled to the first condenser and the evaporator. The evaporation portion is configured to channel an evaporated fluid from the evaporator to the first condenser. The collection portion is configured to channel a condensed fluid from the first condenser to the evaporator.

Another example provides a device that includes a region comprising an integrated device and a heat dissipating means coupled to the region comprising the integrated device. The heat dissipating means is configured to dissipate heat away from the region. The heat dissipating means includes a fluid, an evaporator means configured to evaporate the fluid, a first condenser means configured to condense the fluid, where the condenser means is located in a first wall of the device, an evaporation portion coupled to the evaporator means and the first condenser means, and a collection portion coupled to the first condenser means and the evaporator means. The evaporation portion is configured to channel an evaporated fluid from the evaporator means to the first condenser means. The collection portion is configured to channel a condensed fluid from the condenser means to the evaporator means.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may or may not be shown in block diagrams in order to avoid obscuring the aspects in unnecessary detail. In other instances, well-known circuits, structures and techniques may not be shown in detail in order not to obscure the aspects of the disclosure.

Overview

Some implementations provide a device (e.g., mobile device) that includes a region comprising an integrated device (e.g., chip, die), and a heat dissipating device coupled to the region comprising the integrated device. The heat dissipating device may be a multi-phase heat dissipating device. The heat dissipating device is configured to dissipate heat away from the region. The heat dissipating device includes a fluid, an evaporator configured to evaporate the fluid, a condenser configured to condense the fluid, where the condenser is located in a wall of the device, an evaporation portion coupled to the evaporator and the condenser, and a collection portion coupled to the condenser and the evaporator. The evaporation portion is configured to channel an evaporated fluid from the evaporator to the condenser. The collection portion is configured to channel a condensed fluid from the condenser to the evaporator. In some implementations, the region may include a thermal interface material (TIM) coupled to the integrated device and the heat dissipating device. In some implementations, the region is a heat generating region configured to generate heat when the device (e.g., mobile device) is operational.

Exemplary Multi-Phase Heat Dissipating Device

Figure 1:
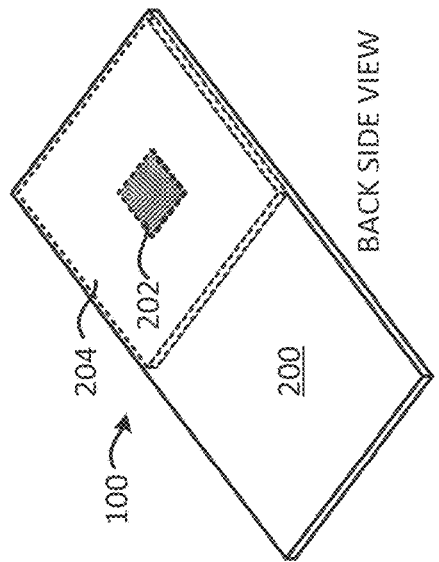
FIG. 1 illustrates a front view of a mobile device.
Figure 2:
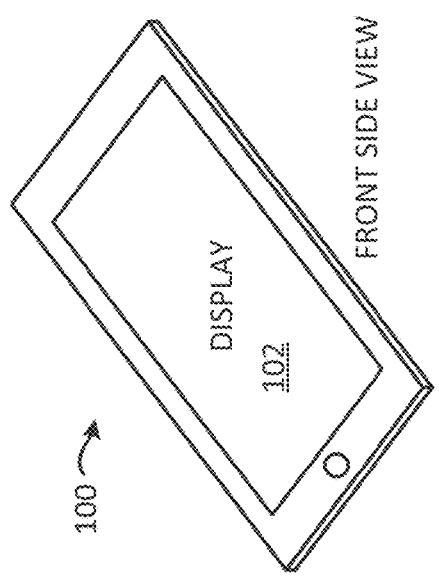
FIG. 2 illustrates a back view of a mobile device that includes a heat spreader.
Figure 3:
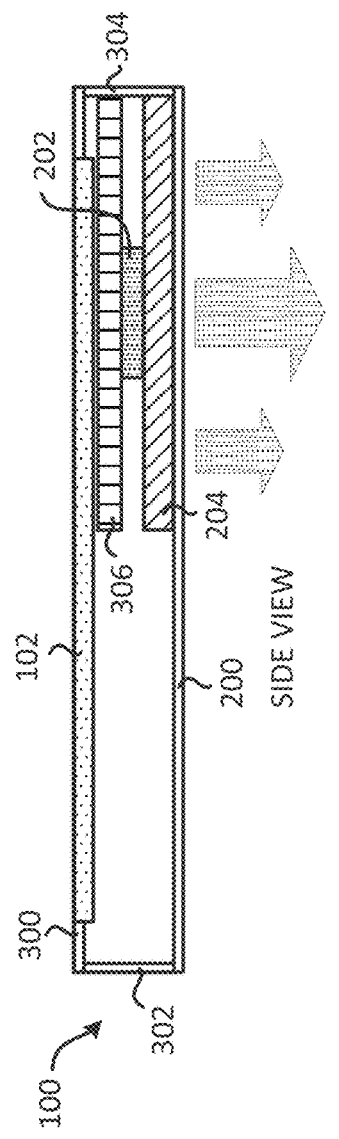
FIG. 3 illustrates a profile view of a mobile device that includes a heat spreader.
Figure 4:
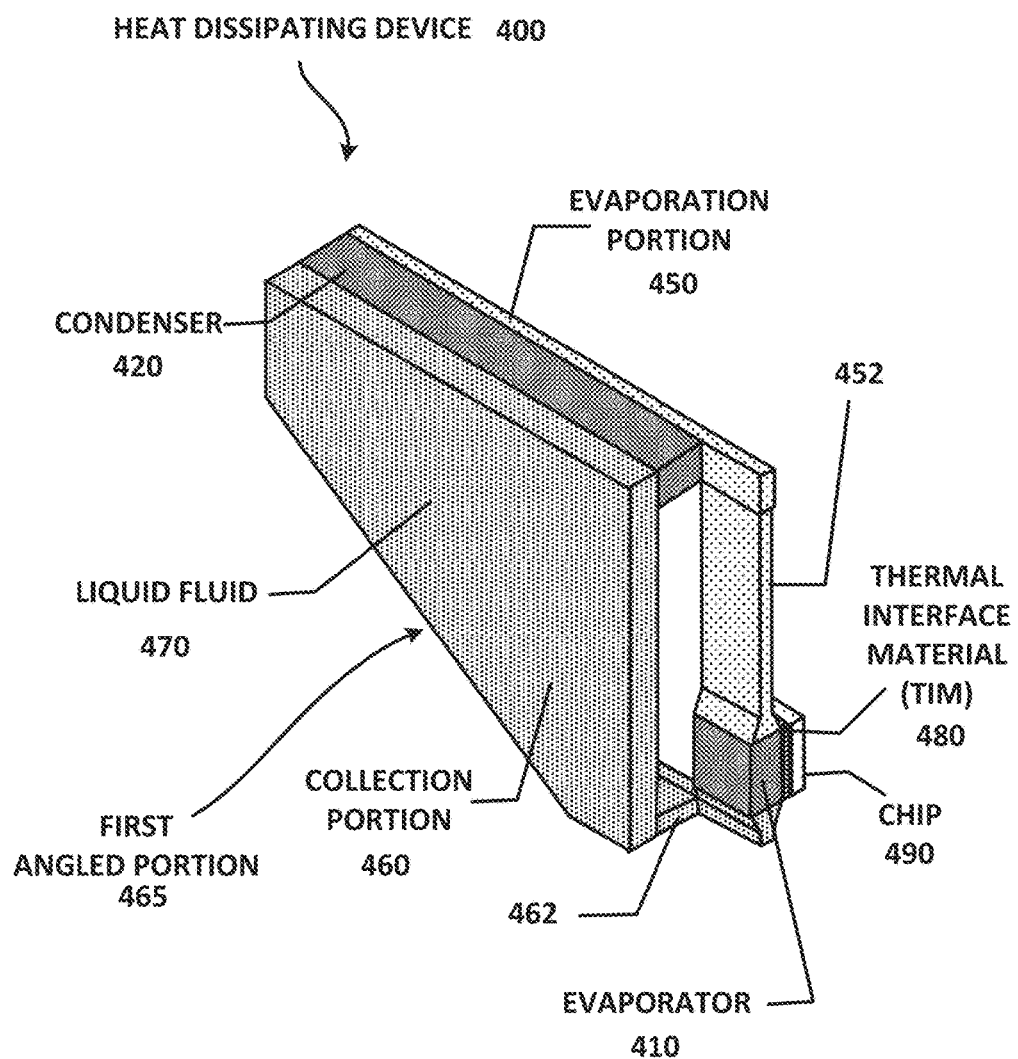
FIG. 4 illustrates a view of a heat dissipating device.

FIG. 4 illustrates a heat dissipating device 400 that includes an evaporator 410, a condenser 420, an evaporation portion 450, an evaporation portion 452, a collection portion 460, a collection portion 462 and a fluid 470. The evaporator 410 may be an evaporator means (e.g., means for evaporating). The condenser 420 may be a condenser means (e.g., means for condensing). The collection portion 460 includes at least one angled portion 465 (e.g., non-orthogonal angled portion). As will be further described below, the at least one angled portion 465 is configured to help direct fluid towards the evaporator 410 (e.g., through gravity).

In some implementations, the heat dissipating device 400 (e.g., heat dissipating means, means for dissipating heat) is a multi-phase heat dissipating device. As will be further described below, the heat dissipating device 400 may be a cooling device that provides heat dissipation through recirculation of a fluid (e.g., fluid 470) without the need of a pump or compressor.

The evaporator 410 is coupled to the evaporation portion 452 and the collection portion 462. The evaporation portion 452 is coupled to the evaporation portion 450. In some implementations, the evaporation portion 450 and the evaporation portion 452 may be considered as one evaporation portion.

The condenser 420 (e.g., first condenser, first condenser means, first means for condensing) is coupled to the evaporation portion 450 and the collection portion 460. The collection portion 460 is coupled to the collection portion 462. In some implementations, the collection portion 460 and the collection portion 462 may be considered as one collection portion.

FIG. 4 illustrates the fluid 470 is located inside the heat dissipating device 400. The fluid 470 is configured to flow inside the heat dissipating device 400. In some implementations, the flow of the fluid 470 inside the heat dissipating device 400 allows for the efficient heat transfer from one portion of the heat dissipating device 400 to another portion of the heat dissipating device 400. For example, the fluid 470 may be configured to allow heat to transfer or flow from the evaporator 410 to the condenser 420. Thus, heat (e.g., from heat generating region, integrated device) coming in through the evaporator 410 may be released through the condenser 420 in some implementations. The larger the size of the condenser 420, the better the cooling of the integrated device 490.

FIG. 4 illustrates that the fluid 470 is located in the collection portion 460 of the heat dissipating device 400. However, in some implementations, the fluid 470 may be located in other portions (e.g., the evaporator 410, the condenser 420, the evaporation portion 450, the evaporation portion 452, the collection portion 462) of the heat dissipating device 400. For example, the fluid 470 may travel through the evaporator 410, the evaporation portion 452, the evaporation portion 450, the condenser 420, the collection portion 460, and the collection portion 462. Although not shown, each of the evaporator 410, the condenser 420, the evaporation portion 450, the evaporation portion 452, the collection portion 460, and the collection portion 462 includes one or more cavities, or one or more space (e.g., internal space) that allows the fluid 470 to flow in the heat dissipating device 400.

The fluid 470 may have different phases, including a liquid phase and a gas phase. In some implementations, the fluid 470 may be a combination of a liquid phase and a gas phase. In some implementations, a vapor phase of the fluid 470 may be a combination of a liquid phase and a gas phase. In some implementations, the temperature at which the fluid changes from a liquid phase to a gas phase is referred to as the boiling temperature of the fluid. In some implementations, the fluid 470 has a boiling temperature of about 40 Celsius or less (boiling temperature will vary based on the type of fluid or refrigerant used). In some implementations, the fluid 470 may be in different phases in different portions of the heat dissipating device 400.

The fluid (e.g., fluid 470) may be provided in the heat dissipating device through a cavity (e.g., hole) formed in the heat dissipating device. After the fluid is provided through the cavity (not shown), the cavity is sealed to create a sealed (e.g., hermetically sealed) heat dissipating device. The cavity may be formed in different portions of the heat dissipating device (e.g., heat dissipating device 400). For example, the cavity and seal may be formed in the collection portion (e.g., collection portion 460, collection portion 462) and/or the evaporation portion (e.g., evaporation portion 450, evaporation portion 452).

A more detailed example of how the fluid 470 may flow in the heat dissipating device 400, how heat may be dissipated and/or transferred, and the different phases of the fluid 470 are further described and illustrated below in FIG. 6.

Figure 5:
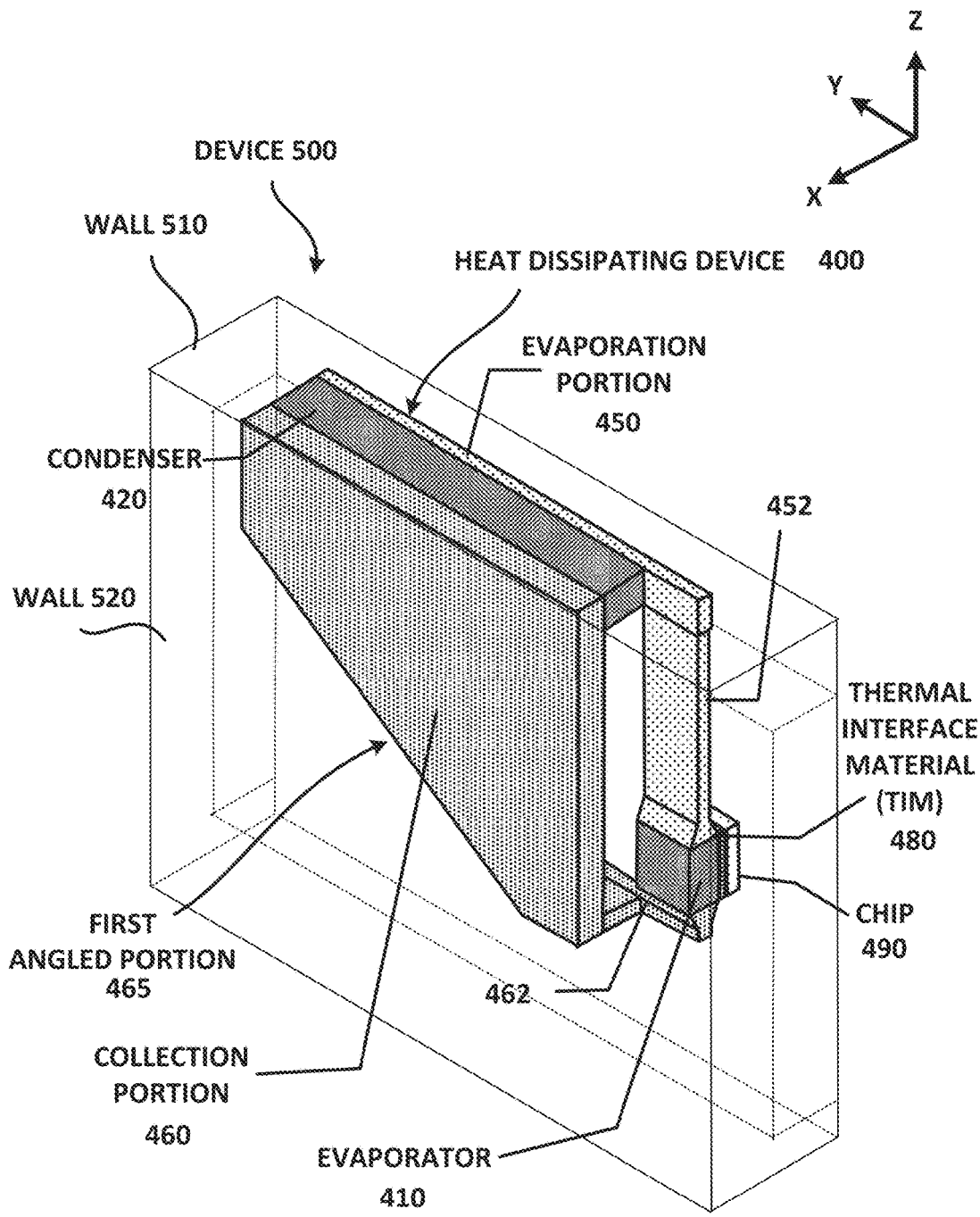
FIG. 5 illustrates a view of the heat dissipating device with respect to a mobile device wall.

FIG. 5 illustrates an example of how a heat dissipating device 400 may be implemented inside a device 500. For purpose of clarity, only a portion of the device 500 is shown in FIG. 5. The device 500 (e.g., mobile device) includes a wall 510 (e.g., first wall) and a wall 520 (e.g., second wall). In some implementations, the wall 520 is the back wall (e.g., back surface) of the device 500. In some implementations, the wall 520 is located opposite to the display and/or screen of the device 500. For the purpose of clarity, two walls are shown for the device 500. However, the device 500 and/or other devices in the present disclosure may include more walls (e.g., first wall, second wall, third wall, fourth wall, fifth wall, sixth wall).

As shown in FIG. 5, the evaporation portion 450 and the condenser 420 are located in the wall 510. In particular, the evaporation portion 450 and the condenser 420 are embedded in the wall 510 (e.g., first wall). The condenser 420 has a size that is as large as possible to maximize the cooling capacity of the integrated device 490. The collection portion 460 is located in the wall 520. In particular, the collection portion 460 is embedded in the wall 520 (e.g., second wall). It is noted that parts of the collection portion 460 may be located in the wall 510. In some implementations, the collection portion 460 is located in the wall (e.g., wall 520) that is opposite to the side of the device 500 that includes a screen or display. FIG. 5 illustrates that the evaporator 410 is located inside the device 500. However, in FIG. 5, the evaporator 410 is not embedded in the walls of the device 500. For example, in some implementations, the evaporator 410 is not part of the wall of the device 500. In addition, the evaporation portion 452 and the collection portion 462 are located inside the device 500. However, the evaporation portion 452 and the collection portion 462 are not embedded in the walls of the device 500. However, in some implementations, the evaporation portion 452 and/or the collection portion 462 may be embedded in one or more walls (e.g., wall 510, wall 520) of the device 500.

In some implementations, the heat dissipating device 400 is a heat dissipating means configured to be coupled to a region (e.g., heat generating region) of a device (e.g., mobile device) that generates heat. The heat generating region may include an integrated device (e.g., die, chip, package, central processing unit (CPU), graphical processing unit (GPU)). The heat generating region may also include a thermal interface material (TIM) that is coupled to the integrated device.

As shown in FIGS. 4 and 5, the heat dissipating device 400 may be coupled to an integrated device 490 (e.g., die, chip, package, central processing unit (CPU), graphical processing unit (GPU)) through an optional thermal interface material (TIM) 480. The thermal interface material (TIM) 480 may be a thermally conductive adhesive that couples the heat dissipating device 400 to the integrated device 490. The thermal interface material (TIM) 480 may include good thermal conductivity properties so that heat generated from the integrated device 490 may thermally conduct to the heat dissipating device 400.

The heat dissipating device 400 is coupled to the integrated device 490 and the thermal interface material (TIM) 480 such that the evaporator 410 is coupled to the integrated device 490 and the thermal interface material (TIM) 480.

As shown in FIGS. 4 and 5, heat from the integrated device 490 thermally conducts through the thermal interface material (TIM) 480 and to the evaporator 410. The evaporator 410 is thus heated, which in turns heats the fluid 470 (which is in liquid phase) from the collection portion 460 and/or the collection portion 462. The fluid 470 that is heated from the evaporator 410 turns into a gas phase or a vapor phase, and then travels from the evaporator 410 through the evaporation portion 452 and/or the evaporation portion 450, and to the condenser 420.

When the fluid 470 (which is in a gas phase or vapor phase) reaches the condenser 420, heat is transferred away from the fluid 470 through the condenser 420, and escapes out of the heat dissipating device 400. Once the fluid 470 passes through the condenser 420, it returns to liquid phase (e.g., or at least partially liquid phase) into the collection portion 460 and/or the collection portion 462. Thus, in some implementations, as the fluid 470 travels through the heat dissipating device 400, the fluid 470 may travel inside at least some of the walls (e.g., wall 510, wall 520) of the device 500. For optimal cooling, it is desirable to condense all the evaporated fluid (e.g., vapor) coming from the evaporator 410, thus the desirability to maximize the size of the condenser 420.

The heat dissipating device 400 may have different configurations. In some implementations, portions of the heat dissipating device 400 may be exposed to an external environment of the device 500 (e.g., condenser 420 may be exposed).

As shown in FIGS. 4 and 5 and the present disclosure, the condenser 420 has a bigger size (e.g., bigger volume) than the evaporator 410. In some implementations, this is done to spread out the heat over a bigger area so has to prevent the device from reaching a critical temperature. In addition, the condenser 420 may have a bigger size than the evaporator 410 to help fully condense the vapors (e.g., evaporated fluid) coming from the evaporator 410. For example, the size of the condenser 420 may be selected so that the heat dissipating device 400 dissipates as much heat as possible while still keeping a surface temperature of the device to be less than an acceptable for a user of the device (e.g., mobile device). Thus, by making the condenser 420 larger (e.g., larger surface area) than the evaporator 410, it ensures that the condenser 420 can effectively dissipate the heat through the evaporator while keeping the surface temperature of the device below a threshold temperature and help fully condense the vapors. In addition, by making the condenser 420 larger than the evaporator 410, it helps prevent dry out in the heat dissipating device 400. Dry out occurs when the condenser 420 is not capable of dissipating heat fast enough, thus is not able to fully convert the vapors into condensate liquid, causing the incomplete condensation of the vapors coming from the evaporator, and thus limiting the cooling capacity of the device and after a few cycles will lead to all vapor and no liquid leading to dry out and device failure. When dry out occurs, the fluid inside the heat dissipating device does not flow, resulting in no recirculation of the fluid in the heat dissipating device 400. FIG. 6 below illustrates a more detailed example of how a fluid may flow inside a heat dissipating device to provide heat dissipation of heat generating region and/or a region comprising an integrated device.

Exemplary Heat Flow of Heat Dissipating Device

Figure 6:
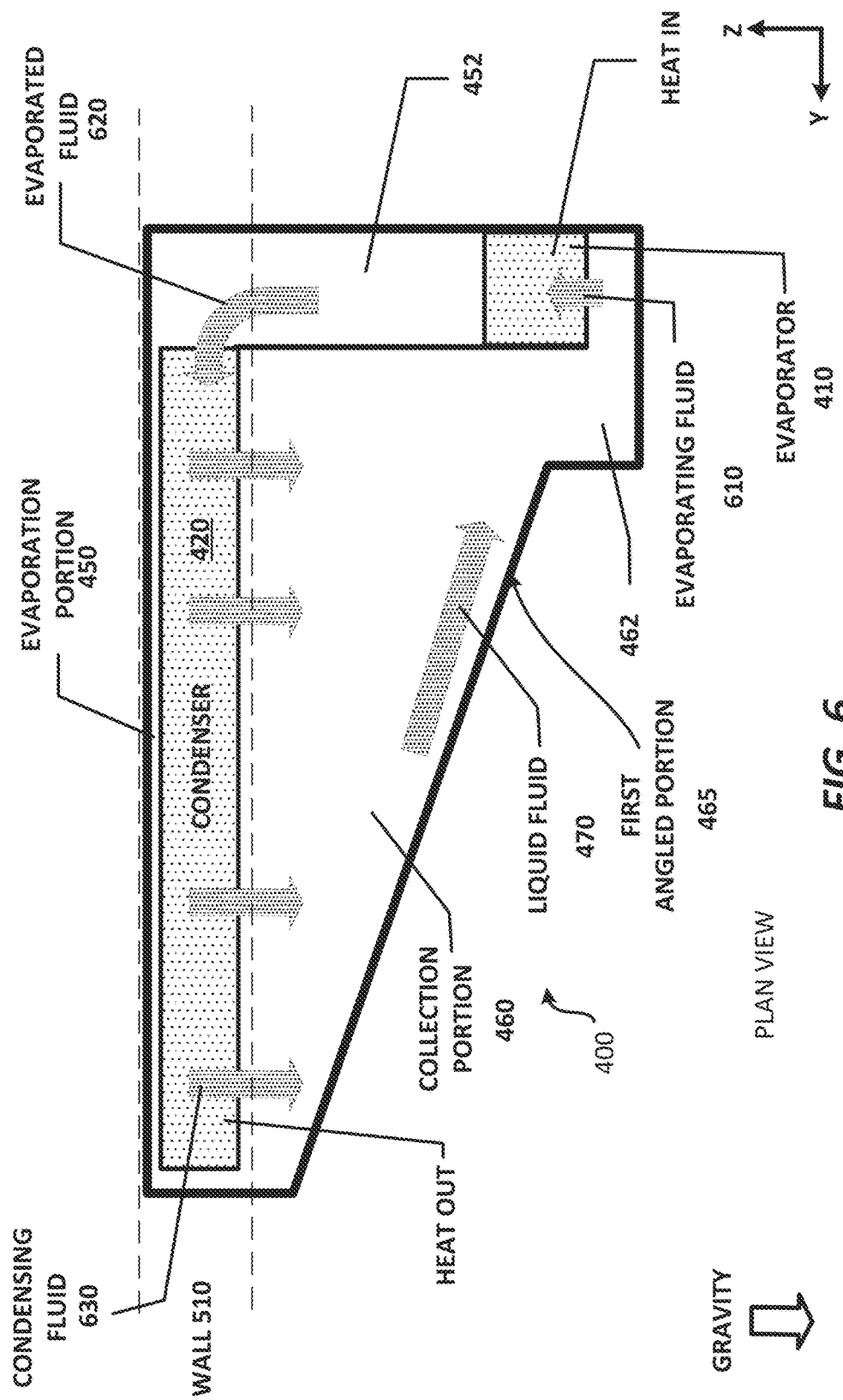
FIG. 6 illustrates a plan view of a heat dissipating device.

FIG. 6 illustrates a fluid flow of the fluid in the heat dissipating device. More, specifically, FIG. 6 illustrates how the fluid flow inside the heat dissipating device 400 provides efficient heat dissipation of a region comprising an integrated device. The heat dissipating device 400 provides a cooling device that is capable of recirculating the fluid without the need of a pump or compressor. In some implementations, the recirculation of the fluid inside the heat dissipating device 400 is aided by gravity. Gravity helps improve the heat dissipating capabilities of the heat dissipating device 400 and allows the heat dissipating device 400 to work properly. The heat dissipating device 400 may be designed in such a way as to perform better in certain orientations (e.g., horizontal orientation of the device, vertical orientation of the device). In some implementations, the optimal orientation of the heat dissipating device 400 is one where the evaporator 410 is positioned lower than the condenser 420, and gravity helps fluid flow from the condenser 420, through the collection portion 460 and towards the evaporator 410.

As mentioned above, the collection portion 460 includes at least one angled portion 465. The at least one angled portion 465 may include a non-orthogonal angled portion. The non-orthogonal angled portion is configured, with the help of gravity, to direct the condensed fluid towards the evaporator 410 (e.g., evaporating means, means for evaporating). In some implementations, the collection portion 460 may include one or more non-orthogonal angled portions. A non-orthogonal portion may include different angles. A non-orthogonal portion is a portion (e.g., wall) that includes a non-right angled portion (e.g., wall) relative to an edge of the heat dissipating device 400.

FIG. 6 illustrates the fluid 470 in the collection portion 460 of the heat dissipating device 400. The collection portion 460 has at least one angled portion (e.g., first angled portion) so that the fluid 470 (which is in liquid form) flows down (e.g., due to gravity) towards the collection portion 462 and the evaporator 410. It is noted that the collection portion 460 and the collection portion 462 may be considered as one collection portion. The evaporator 410 is being heated by a heat generating region (e.g., region comprising TIM and/or integrated device).

As the fluid 470 enters the evaporator 410 and travels through the evaporator 410, the fluid 470 becomes an evaporating fluid 610 due to the heat from heat source (e.g., integrated device) that is passed through the evaporator 410. The evaporator 410 is configured so that the pressure drop between the fluid entering the evaporator 410 and the fluid exiting the evaporator 410 is about 0.0049 bar or less. In some implementations, the pressure drop across the evaporator 410 needs to be below 0.0049 bar so that the fluid is not blocked from passing through the evaporator 410, which would block the recirculation of the fluid in the heat dissipating device 400. The above values are merely exemplary. Different designs may have different values.

Once the evaporating fluid 610 exits the evaporator 410, the evaporating fluid 610 becomes an evaporated fluid 620 (e.g., vapor fluid) that travels through the evaporation portion 452 and the evaporation portion 450 towards the condenser 420. It is noted that the evaporation portion 450 and the evaporation portion 452 may be considered as one evaporation portion. The evaporated fluid 620 may include fluid in a gas phase and some fluid in liquid phase.

As the evaporated fluid 620 enters the condenser 420 (which may be located in the wall 510 of the device) and travels through the condenser 420, the evaporated fluid 620 becomes a condensing fluid 630. This process takes heat away from the evaporated fluid 620 and through the condenser 420. The heat from the condenser 420 then escapes out of the heat dissipating device 400 (e.g., out of the device 500 into an external environment).

In some implementations, the condenser 420 is configured so that the pressure drop between the fluid entering the condenser 420 and the fluid exiting the condenser 420 is about 0.0002 bar or less. In some implementations, the pressure drop across the condenser 420 needs to be below 0.0002 bar so that the fluid is not blocked from travelling through the condenser 420, which would block the recirculation of the fluid in the heat dissipating device 400.

Once the condensing fluid 630 exits of the condenser 420, the condensing fluid 630 returns to the collection portion 460 (which may be located in the wall 520 of the device 500) as the fluid 470, in liquid phase, and the cycle repeats itself (e.g., there is recirculation of the fluid).

FIG. 6 illustrates how the heat dissipating device 400 uses recirculation of a fluid to achieve heat dissipation and cooling without the need of a pump or compressor to move the fluid, using gravity, to return the condensed fluid, back to the evaporator 410. In some implementations, fluid recirculation in the heat dissipating device 400 is possible through the use of the various designs and/or components of the heat dissipating device 400. In some implementations, it is important that the evaporated fluid 620 and the fluid 470 are separated so that there is recirculation of the fluid in the heat dissipating device 400 and to prevent vapor and liquid mixing.

In one example, the evaporator 410 and the condenser 420 are designed in such a way as to minimize the pressure drop as the fluid travels across the evaporator 410 and the condenser 420. The minimizing of pressure drops can be achieved by selecting appropriate dimensions for the channels in which the fluid travels through. Examples of dimensions for the channels for the evaporator 410 and the condenser 420 are described below in at least FIGS. 19-20.

In another example, the dimensions of the evaporator 410 and the condenser 420 are selected so as to prevent dry out in the heat dissipating device 400. As mentioned above, dry out is when the condenser 420 is not dissipating heat fast enough in the heat dissipating device 400 (relative to how fast heat is coming in from the evaporator 410), causing the fluid in heat dissipating device 400 to turn into a gas phase (with little or no liquid phase). When dry out occurs, little or no recirculation occurs. Examples of dimensions for the evaporator 410 and the condenser 420 are described below in at least FIGS. 19-20.

In some implementations, the heat dissipating device 400 operates optimally when the heat dissipating device 400 is arranged such that the evaporator 410 is located lower than the condenser 420, so as to take advantage of gravity pulling the fluid 470 towards the evaporator 410.

In some implementations, fluid recirculation in the heat dissipating device occurs when the temperature of the fluid is about 40 degree Celsius or higher (e.g., boiling temperature of the fluid). However, fluid recirculation may begin at different temperatures for different implementations, various fluids and various coolants.

Figure 7:
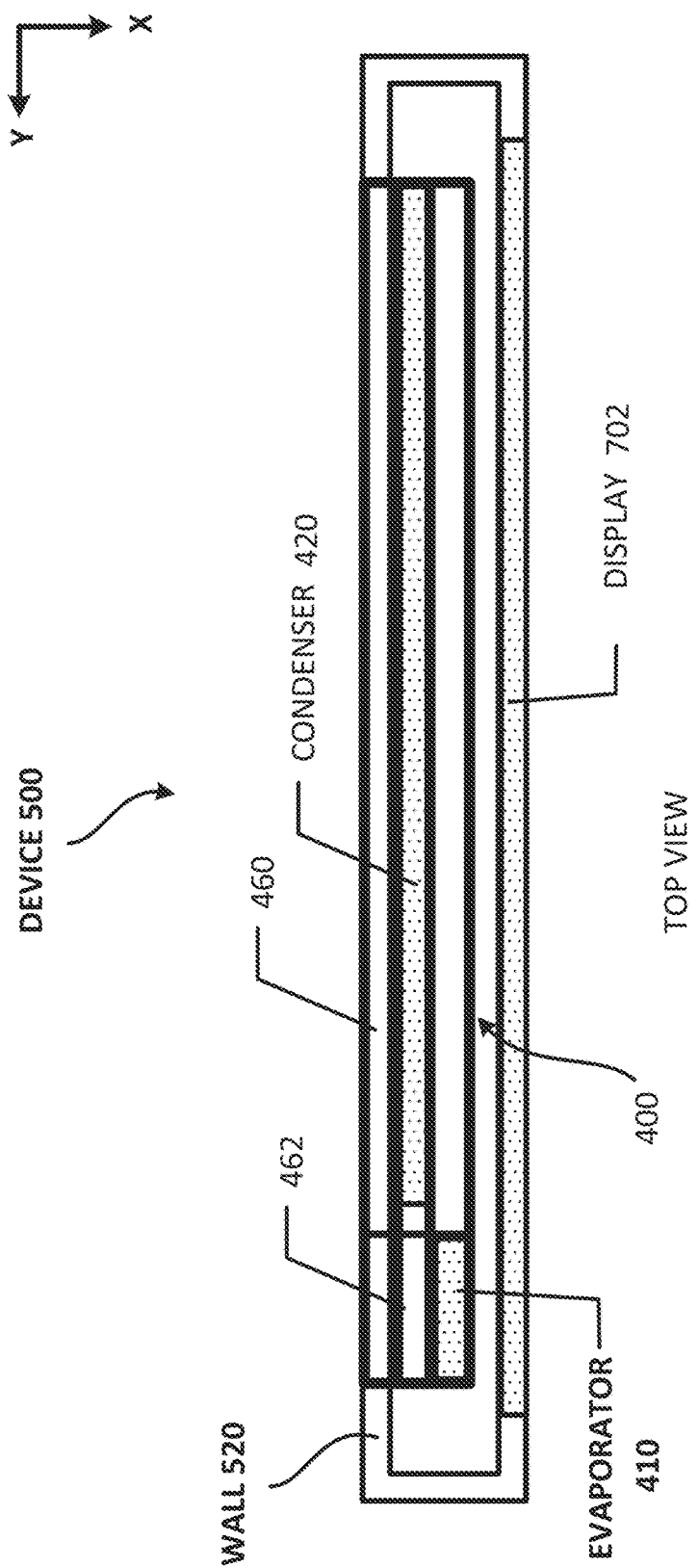
FIG. 7 illustrates a profile view of a heat dissipating device.

FIG. 7 illustrates a top view of the heat dissipating device 400 implemented in the device 500. As shown in FIG. 7, the condenser 420 is implemented in the wall 510 of the device 500 (e.g., mobile device), and the evaporator 410 is located inside the device 500. In particular, the condenser 420 is embedded in the wall 510 of the device 500. The evaporator 410 may be coupled to a heat generating region and/or a region that includes an integrated device and/or TIM. The device 500 includes a display 702. The display 702 is located opposite to the wall 520.

Figure 8:
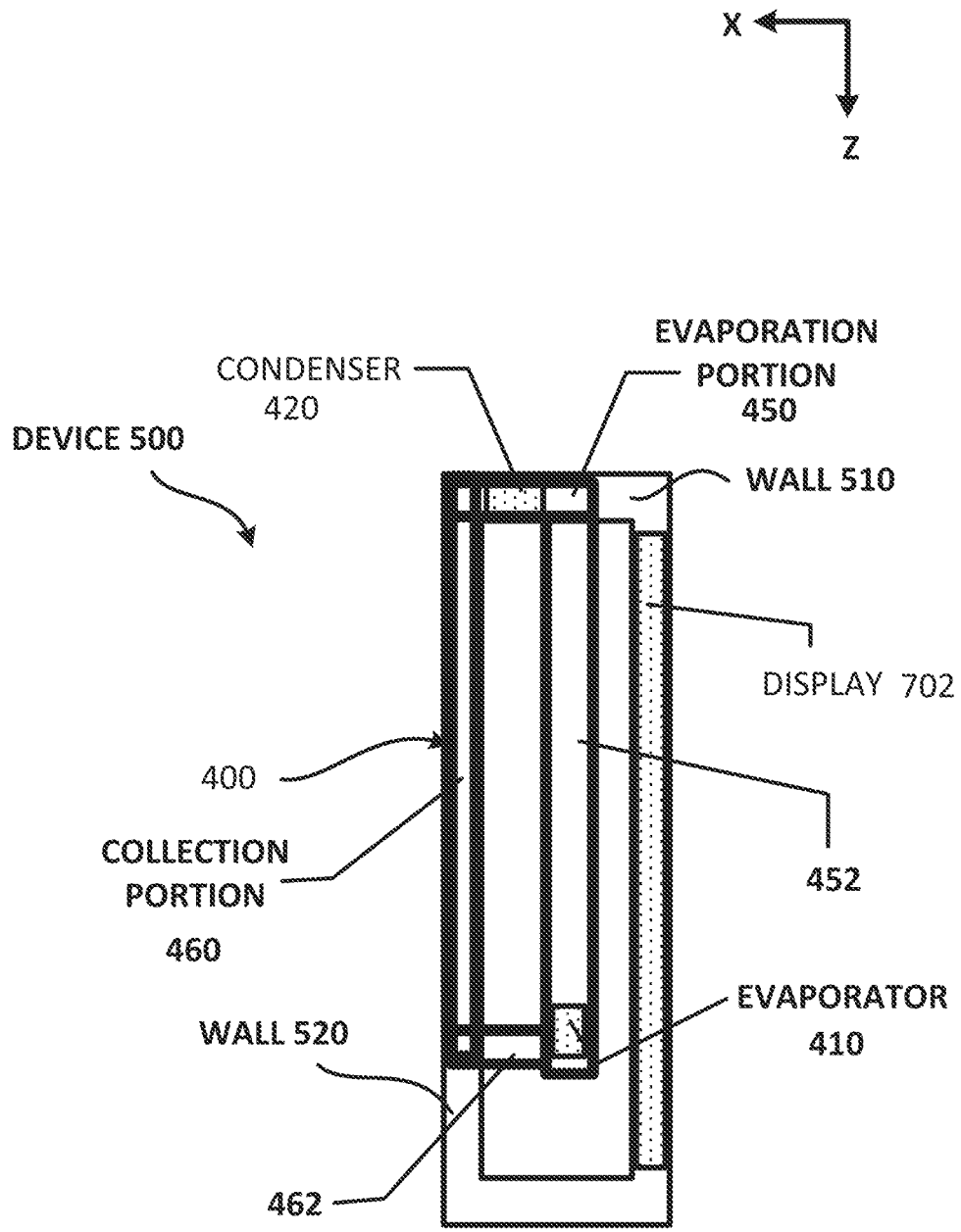
FIG. 8 illustrates another profile view of a heat dissipating device.

FIG. 8 illustrates a profile view of the heat dissipating device 400 implemented in the device 500. As shown in FIG. 8, the condenser 420 is implemented in the wall 510 of the device 500 (e.g., mobile device), the collection portion 460 is implemented inside the wall 520 of the device 500. The wall 520 may be opposite to the side or wall of the device that includes a screen or display (e.g., display 702). The evaporator 410 is located inside the device 500. In particular, the condenser 420 is embedded in the wall 510 of the device 500, and the collection portion 460 is embedded in the wall 520 of the device 500. The evaporator 410 may be coupled to a heat generating region and/or a region that includes an integrated device and/or TIM.

Exemplary Materials and Fluids

The heat dissipating device 400 and its components may include different materials. In some implementations, the evaporator 410 and the condenser 420 may include a thermally conductive material, such as metal, copper, Aluminum, Aluminum-Nitride (Ceramic), and/or combination thereof.

Table 1 below illustrates exemplary materials and their corresponding properties for materials that may be used in the heat dissipating device 400, or any heat dissipating device described in the present disclosure.

TABLE 1

Exemplary Materials and Properties for components of heat dissipating device

| Material | Density (kg/m³) | Thermal Conductivity Value (Watts/m-C.) | Specific Heat (Joules/kg-C.) |
|---|---|---|---|
| Copper | 8933 | 388 | 385 |
| Aluminum | 2707 | 770 | 896 |
| Aluminum - Nitride (Ceramic) | 3320 | 177 | 780 |

A particular thermal conductivity value of a particular material quantifies how well or how poorly a particular material conducts heat. Different implementations may also use different fluids in the heat dissipating device 400. Table 2 below illustrates exemplary fluids and their corresponding properties.

TABLE 2

Exemplary Fluids and Properties

| Fluid | Liquid Density (kg/m³) | Liquid Viscosity (mPa-s) | Latent Heat (Joules/kg-K.) | Specific Heat (Joules/kg-K.) |
|---|---|---|---|---|
| Refrigerant R134a | 1218 | 202.3 | 177.8 | 1424.6 |
| Refrigerant R236fa | 1369.8 | 296.5 | 145.9 | 1264.4 |
| Refrigerant R245fa | 1346.6 | 423.3 | 190.3 | 1264.4 |
| Refrigerant R1234ze | 1165.5 | 209.6 | 167.1 | 1388.7 |

In some implementations, the heat dissipating device 400 may use different combinations of the materials and/or fluids listed above. However, it is noted that other implementations may use different materials and fluids, or combinations thereof than the ones listed above.

The use of the materials and the design of the heat dissipating device in the present disclosure allows for effective and efficient heat transfer or heat removal from a heat generating region of a device. In some implementations, the evaporator 410 may be configured to have a maximum heat transfer coefficient of about 32.8 kW/m²k. In some implementations, the condenser 420 is configured to have a maximum heat transfer coefficient of about 9.27 kW/m²k. However, different implementations may have different maximum heat transfer coefficients.

In some implementations, the evaporator 410 may comprise a critical heat flux at exit of about 26.9 W/cm². In some implementations, the heat dissipating device 400 may be configured to dissipate up to about 18 Watts of heat, which is substantially more than the heat spreader 204 (which is rated at about 3 Watts for mobile devices). In some implementations, the heat dissipating device 400 may be able to dissipate the above mentioned heat while having dimensions that measure about 135 mm (L)×65 mm (W)×0.6 mm (H) or less. Thus, given its dimensions, the heat dissipating device 400 may be implemented in a mobile device to dissipate much more heat than the heat spreader 204.

Exemplary Multi-Phase Heat Dissipating Devices

Figure 9:
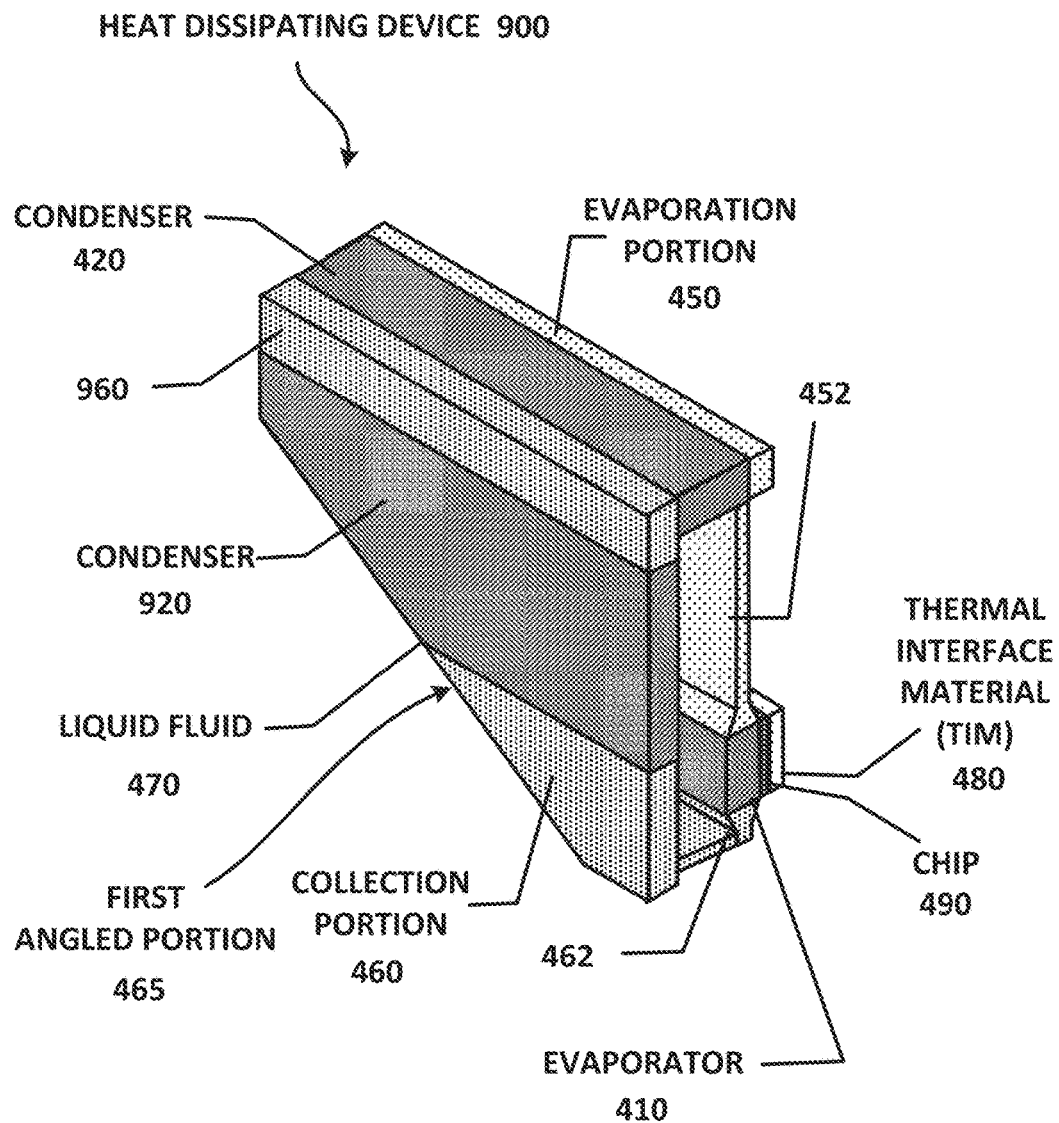
FIG. 9 illustrates a view of another heat dissipating device.

The heat dissipating device 400 may have different configurations. FIG. 9 illustrates a heat dissipating device 900 that includes two condensers. The heat dissipating device 900 is similar to the heat dissipating device 400 of FIG. 4.

The heat dissipating device 900 includes the evaporator 410, the condenser 420 (e.g., first condenser), a condenser 920 (e.g., second condenser, second condenser means, first means for condensing), the evaporation portion 450, the evaporation portion 452, the collection portion 460, the collection portion 462, a collection portion 960, and a fluid 470. In some implementations, the additional condenser (e.g., condenser 920) provides improved heat dissipation functionality for the heat dissipating device 900, and thus leads to increased cooling capacity of the entire device and system.

Figure 10:
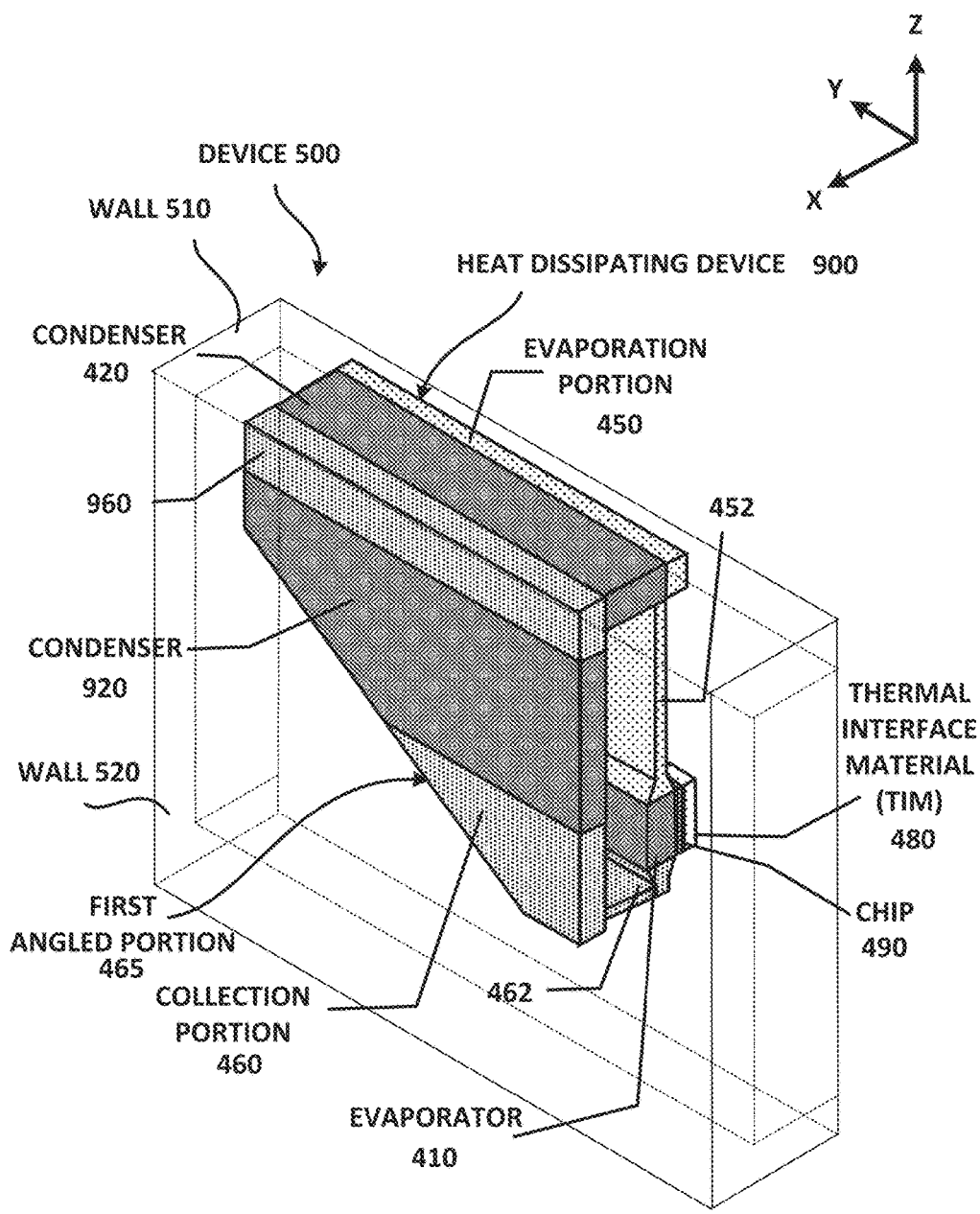
FIG. 10 illustrates a view of the heat dissipating device with respect to a mobile device wall.

FIG. 10 illustrates an example of how a heat dissipating device 900 may be implemented inside the device 500. The device 500 (e.g., mobile device) includes a wall 510 (e.g., first wall) and a wall 520 (e.g., second wall). In some implementations, the wall 520 is the back wall of the device 500. In some implementations, the wall 520 is located opposite to the display and/or screen of the device 500. For the purpose of clarity, two walls (e.g., wall 510, wall 520) are shown for the device 500. However, the device 500 and/or other devices in the present disclosure may include more walls (e.g., first wall, second wall, third wall, fourth wall, fifth wall, sixth wall).

As shown in FIG. 10, the evaporation portion 450 and the condenser 420 are located in the wall 510. In particular, the evaporation portion 450 and the condenser 420 are embedded in the wall 510 (e.g., first wall). The condenser 920 and the collection portion 460 are located in the wall 520. In particular, the condenser 920 and the collection portion 460 are embedded in the wall 520 (e.g., second wall). The collection portion 960 is located in both the wall 510 and the wall 520. In some implementations, the condenser 920 and the collection portion 460 are located in the wall (e.g., wall 520) that is opposite to the side of the device 500 that includes a screen or display (e.g., display 702). In some implementations, the second condenser (e.g., condenser 920) provides more heat transfer capabilities and helps better condense the uncondensed fluid (e.g., vapor) coming from the condenser 420 (e.g., first condenser). By placing the condenser 920 near a surface area of the device 500, improved heat transfer capabilities can be achieved.

The flow of the fluid 470 in heat dissipating device 900 is similar as in the heat dissipating device 400.

Exemplary Heat Flow of Heat Dissipating Device

Figure 11:
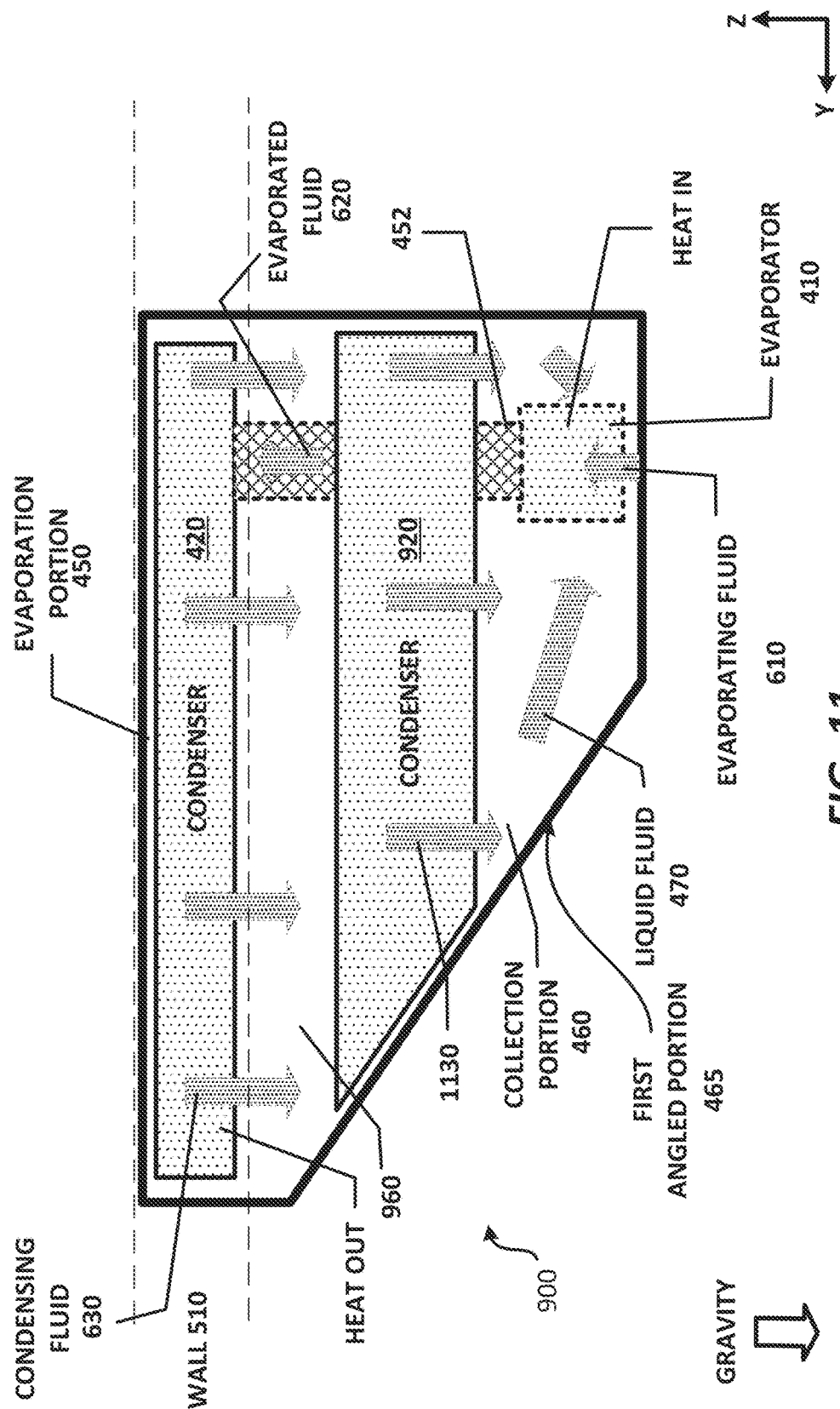
FIG. 11 illustrates a plan view of another heat dissipating device.

FIG. 11 illustrates a fluid flow of the fluid in the heat dissipating device. More, specifically, FIG. 11 illustrates how the fluid flow inside the heat dissipating device 900 provides efficient heat dissipation of an integrated device. The heat dissipating device 900 provides a cooling device that is capable of recirculating the fluid without the need of a pump or compressor. In some implementations, the recirculation of the fluid inside the heat dissipating device 900 is aided by gravity. Gravity helps improve the heat dissipating capabilities of the heat dissipating device 900 and allows the heat dissipating device 900 to work properly. The heat dissipating device 900 may be designed in such a way as to perform better in certain orientations (e.g., horizontal orientation of the device, vertical orientation of the device). In some implementations, the optimal orientation of the heat dissipating device 900 is one where the evaporator 410 is positioned lower than the condenser 420 and the condenser 920 and gravity helps fluid flow from the condenser 420 and the condenser 920, through the collection portion 460 and towards the evaporator 410.

As mentioned above, the collection portion 460 includes at least one angled portion 465. The at least one angled portion 465 may include a non-orthogonal angled portion. The non-orthogonal angled portion is configured, with the help of gravity, to direct the condensed fluid towards the evaporator 410 (e.g., evaporating means, means for evaporating). In some implementations, the collection portion 460 may include one or more non-orthogonal angled portions. A non-orthogonal portion may include different angles. A non-orthogonal portion is a portion (e.g., wall) that includes a non-right angled portion (e.g., wall) relative to an edge of the heat dissipating device 900.

FIG. 11 illustrates the fluid 470 in the collection portion 460 of the heat dissipating device 900. At least some of the collection portion 460 may be implemented in the wall 520 of the device 500. The collection portion 460 has an angled portion so that the fluid 470 (which is in liquid form) flows down (e.g., due to gravity) towards the collection portion 462 and the evaporator 410. It is noted that the collection portion 460 and the collection portion 462 may be considered as one collection portion. The evaporator 410 is being heated by a heat generating region (e.g., region comprising TIM and/or integrated device).

As the fluid 470 enters the evaporator 410 and travels through the evaporator 410, the fluid 470 becomes an evaporating fluid 610 due to the heat from heat source (e.g., integrated device) that is passed through the evaporator 410. The evaporator 410 is configured so that the pressure drop between the fluid entering the evaporator 410 and the fluid exiting the evaporator 410 is about 0.0049 bar or less. In some implementations, the pressure drop across the evaporator 410 needs to be below 0.0049 bar so that the fluid is not blocked from travelling through the evaporator 410, which would block the recirculation of the fluid in the heat dissipating device 900. Different implementations may have properties.

Once the evaporating fluid 610 exits the evaporator 410, the evaporating fluid 610 becomes the evaporated fluid 620 that travels through the evaporation portion 452 and the evaporation portion 450, towards the condenser 420. It is noted that the evaporation portion 450 and the evaporation portion 452 may be considered as one evaporation portion.

The evaporated fluid 620 may include fluid in a gas phase and some fluid in liquid phase. The condenser 920 (e.g., second condenser) will help condense into fluid 470 (e.g., condensed fluid) the condensing fluid 630 (vapor portion) coming from the condenser 420 (e.g., first condenser).

As the evaporated fluid 620 enters the condenser 420 (which may be located in the wall 510 of the device) and travels through the condenser 420, the evaporated fluid 620 becomes a condensing fluid 630. This process takes heat away from the evaporated fluid 620 and through the condenser 420. The heat from the condenser 420 then escapes out of the heat dissipating device 900.

In some implementations, the condenser 420 is configured so that the pressure drop between the fluid entering the condenser 420 and the fluid exiting the condenser 420 is about 0.0002 bar or less. In some implementations, the pressure drop across the condenser 420 needs to be below 0.0002 bar so that the fluid is not blocked from travelling through the condenser 420, which would block the recirculation of the fluid in the heat dissipating device 900. Different implementations may have properties.

After the condensing fluid 630 exits of the condenser 420, the condensing fluid 630 travels through the collection portion 960 (which may be located in the wall 510 and/or the wall 520 of the device 500) and through the condenser 920 (which may be located in the wall 520). This process also takes heat away from the condensing fluid 1130 and through the condenser 920. The heat from the condenser 920 then escapes out of the heat dissipating device 900.

Once the condensing fluid 1130 exits of the condenser 920, the condensing fluid 1130 returns to the collection portion 460 (which may be located in the wall 520 of the device 500) as the fluid 470, in liquid phase, and the cycle repeats itself (e.g., there is recirculation of the fluid). The larger the overall size of the condenser(s) (e.g., condenser 420, 920) the better the cooling capacity of the heat dissipating device 1200.

FIG. 11 illustrates how the heat dissipating device 900 uses recirculation of a fluid to achieve heat dissipation and cooling without the need of a pump or compressor to move the fluid. In some implementations, fluid recirculation in the heat dissipating device 900 is possible through the use of the various designs and/or components of the heat dissipating device 900. The heat dissipating device 900 may be designed in such a way as to perform better in certain orientations (e.g., horizontal orientation of the device, vertical orientation of the device). In some implementations, the optimal orientation of the heat dissipating device 900 is one where the evaporator 410 is positioned lower than the condenser 420 and the condenser 920, and gravity helps fluid flow from the condenser 420 and the condenser 920, through the collection portion 460 and collection portion 960 and towards the evaporator 410.

Exemplary Multi-Phase Heat Dissipating Devices

Figure 12:
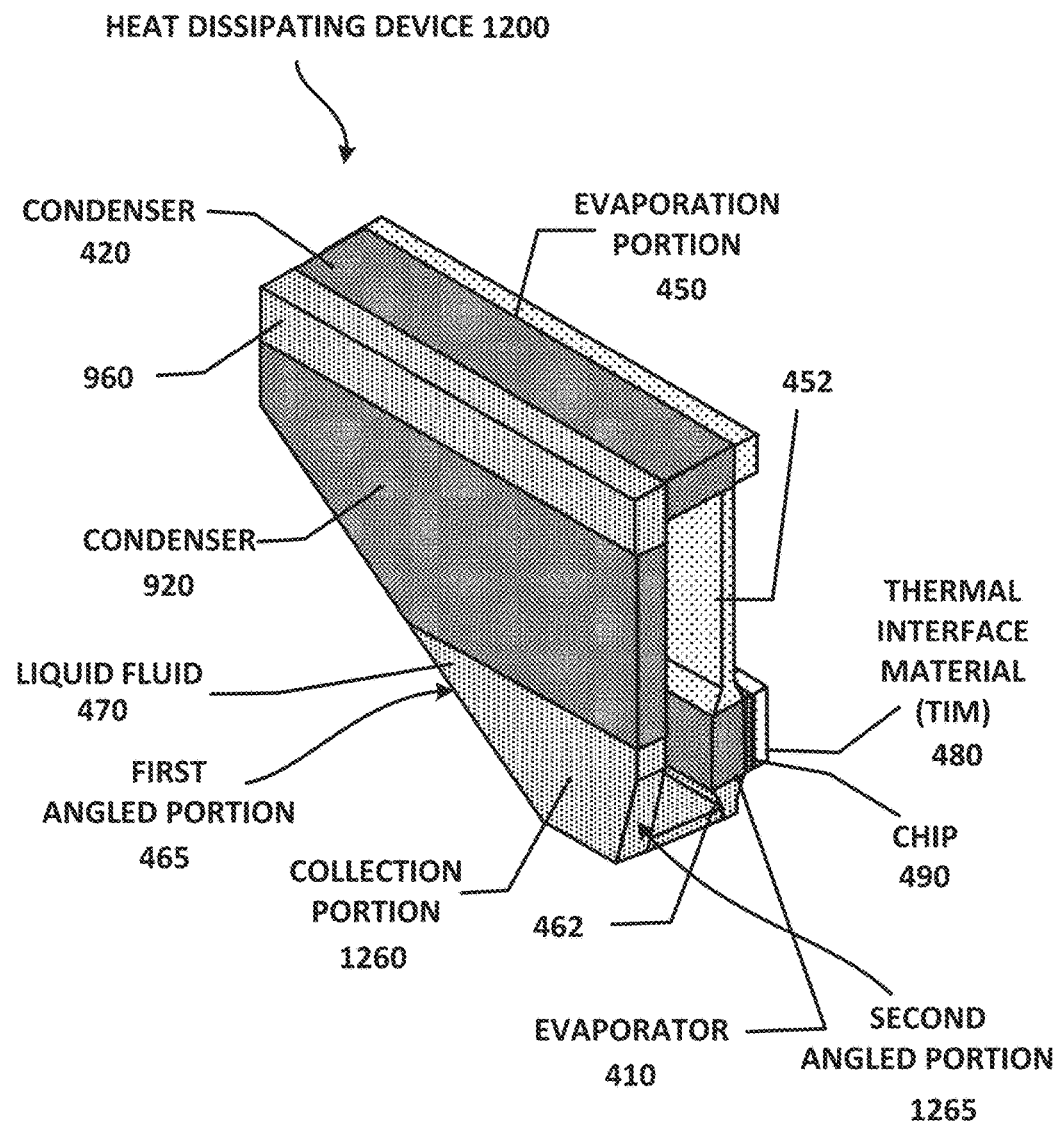
FIG. 12 illustrates a view of a heat dissipating device.

FIG. 12 illustrates a heat dissipating device 1200 that includes two condensers and two angled portions in a collection portion. The heat dissipating device 1200 is similar to the heat dissipating device 900 of FIG. 9.

The heat dissipating device 1200 includes the evaporator 410, the condenser 420, the condenser 920, the evaporation portion 450, the evaporation portion 452, the collection portion 1260, the collection portion 462, a collection portion 960, and a fluid 470. In some implementations, the additional condenser (e.g., condenser 920) provides improved heat dissipation functionality for the heat dissipating device 1200 in FIG. 12. In addition, the collection portion 1260 includes two angled portions (e.g., first angled portion 465, second angled portion 1265) that facilitate fluid flow towards collection portion 462 and the evaporator 410. The first angled portion 465 includes a first non-orthogonal angled portion, and the second angled portion 1265 includes a second non-orthogonal angled portion.

Figure 13:
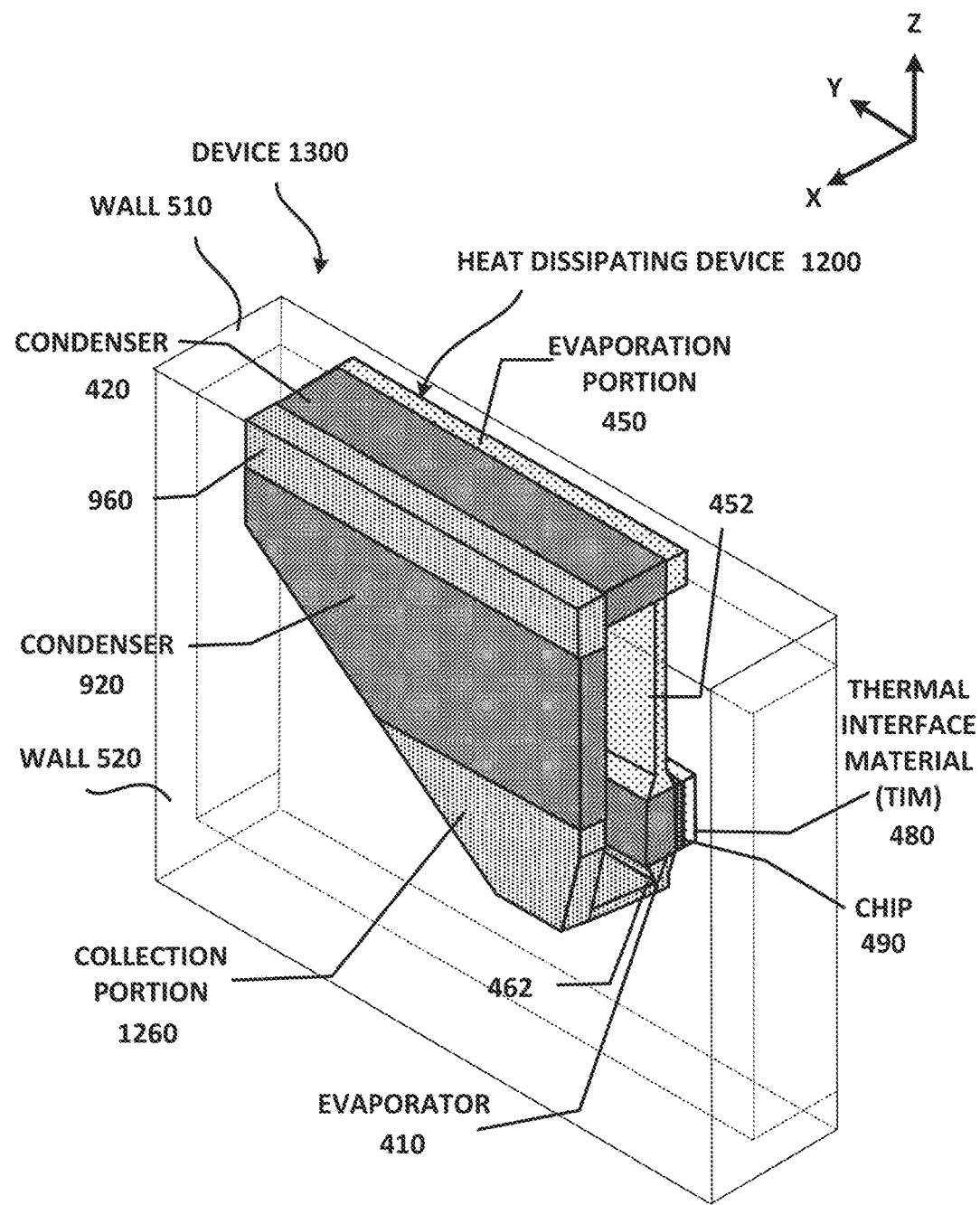
FIG. 13 illustrates a view of the heat dissipating device with respect to a mobile device wall.

FIG. 13 illustrates an example of how a heat dissipating device 1200 may be implemented inside the device 1300. The device 1300 (e.g., mobile device) includes a wall 510 (e.g., first wall) and a wall 520 (e.g., second wall). In some implementations, the wall 520 is the back wall of the device 1300 in FIG. 13. In some implementations, the wall 520 is located opposite to the display and/or screen of the device 1300. For the purpose of clarity, two walls are shown for the device 1300 However, the device 1300 and/or other devices in the present disclosure may include more walls (e.g., first wall, second wall, third wall, fourth wall, fifth wall, sixth wall).

As shown in FIG. 13, the evaporation portion 450 and the condenser 420 are located in the wall 510. In particular, the evaporation portion 450 and the condenser 420 are embedded in the wall 510 (e.g., first wall). The condenser 920 and the collection portion 1260 are located in the wall 520. In particular, the condenser 920 and the collection portion 1260 are embedded in the wall 520 (e.g., second wall). The collection portion 960 is located in both the wall 510 and the wall 520. In some implementations, the condenser 920 and the collection portion 1260 are located in the wall (e.g., wall 520) that is opposite to the side of the device 1300 that includes a screen or display. In some implementations, the second condenser (e.g., condenser 920) provides more heat transfer capabilities. By placing the condenser 920 near a surface area of the device 1300, improved heat transfer capabilities can be achieved.

The flow of the fluid 470 in the heat dissipating device 1200 is similar as in the heat dissipating device 900.

Exemplary Heat Flow of Heat Dissipating Device

Figure 14:
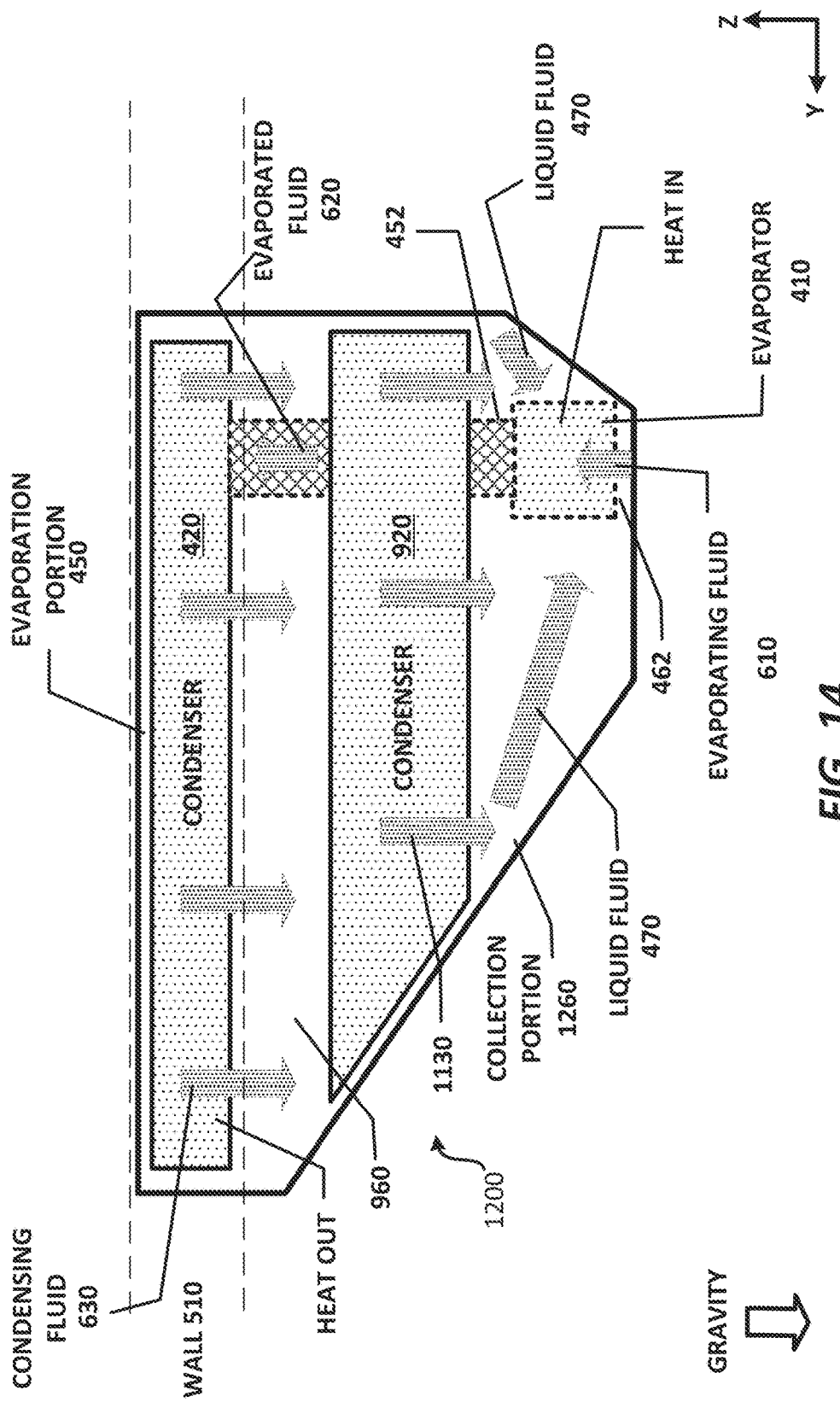
FIG. 14 illustrates a plan view of a heat dissipating device.

FIG. 14 illustrates a fluid flow of the fluid in the heat dissipating device. More, specifically, FIG. 14 illustrates how the fluid flow inside the heat dissipating device 1200 provides efficient heat dissipation of an integrated device. The heat dissipating device 1200 provides a cooling device that is capable of recirculating the fluid without the need of a pump or compressor. In some implementations, the recirculation of the fluid inside the heat dissipating device 1200 is aided by gravity. As mentioned above, gravity helps improve the heat dissipating capabilities of the heat dissipating device 1200.

FIG. 14 illustrates the fluid 470 in the collection portion 1260 of the heat dissipating device 1200. The fluid 470 may flow in the heat dissipating device 1200 in a similar manner as described for the heat dissipating device 1200 in FIG. 11. At least some of the collection portion 1260 may be implemented in the wall 520 of the device 500. The collection portion 1260 has an angled portions (e.g., first angled portion 465, second angled portion 1265) so that the fluid 470 (which is in liquid form) flows down (e.g., due to gravity) towards the collection portion 462 and the evaporator 410. It is noted that the collection portion 1260 and the collection portion 462 may be considered as one collection portion. The evaporator 410 is being heated by a heat generating region (e.g., TIM, integrated device).

As the fluid 470 enters the evaporator 410 and travels through the evaporator 410, the fluid 470 becomes an evaporating fluid 610, in FIG. 14, due to the heat from heat source (e.g., integrated device) that is passed through the evaporator 410. The evaporator 410 is configured so that the pressure drop between the fluid entering the evaporator 410 and the fluid exiting the evaporator 410 is about 0.0049 bar or less. In some implementations, the pressure drop across the evaporator 410 needs to be below 0.0049 bar so that the fluid is not blocked from travelling through the evaporator 410, which would block the recirculation of the fluid in the heat dissipating device 1200. Different implementations may have different values.

Once the evaporating fluid 610, in FIG. 14, exits the evaporator 410, the evaporating fluid 610 becomes an evaporated fluid 620 that travels through the evaporation portion 452 and the evaporation portion 450 towards the condenser 420. It is noted that the evaporation portion 450 and the evaporation portion 452 may be considered as one evaporation portion. The evaporated fluid 620 may include fluid in a gas phase and some fluid in liquid phase.

As the evaporated fluid 620 enters the condenser 420 (which may be located in the wall 510 of the device) and travels through the condenser 420, the evaporated fluid 620 becomes a condensing fluid 630. This process takes heat away from the evaporated fluid 620 and through the condenser 420. The heat from the condenser 420 then escapes out of the heat dissipating device 1200.

In some implementations, the condenser 420 is configured so that the pressure drop between the fluid entering the condenser 420 and the fluid exiting the condenser 420 is about 0.0002 bar or less. In some implementations, the pressure drop across the condenser 420 needs to be below 0.0002 bar so that the fluid is not blocked from travelling through the condenser 420, which would block the recirculation of the fluid in the heat dissipating device 1200. Different implementations may have different values.

After the condensing fluid 630 exits of the condenser 420, the condensing fluid 630 travels through the collection portion 960 (which may be located in the wall 510 and/or the wall 520 of the device 500) and through the condenser 920 (which may be located in the wall 520). This process also takes heat away from the condensing fluid 1130 and through the condenser 920. The heat from the condenser 920 then escapes out of the heat dissipating device 1200. The condenser 920 helps condense the condensing fluid 630 (vapor portion) coming from the condenser 420 into the fluid 470.

Once the condensing fluid 1130 exits of the condenser 920, the condensing fluid 1130 returns to the collection portion 1260 (which may be located in the wall 520 of the device 500) as the fluid 470, in liquid phase, and the cycle repeats itself (e.g., there is recirculation of the fluid).

FIG. 14 illustrates how the heat dissipating device 1200 uses recirculation of a fluid to achieve heat dissipation and cooling without the need of a pump or compressor to move the fluid. In some implementations, fluid recirculation in the heat dissipating device 1200 is possible through the use of the various designs and/or components of the heat dissipating device 1200. In addition, the angled portions (e.g., 465, 1265) of the collection portion 1260 help return the fluid, through gravity, to the evaporator 410.

Exemplary Heat Dissipating Devices

FIGS. 15-18 illustrate profile views of various heat dissipating devices with different configurations. The heat dissipating devices (e.g., 1500-1800) shown in FIGS. 15-18 may be more detailed examples of the heat dissipating devices (e.g., 400, 900, 1200) described in the present disclosure. In some instances, not all the components of the heat dissipating devices are shown in order to not obscure other components of the heat dissipating devices.

Figure 15:
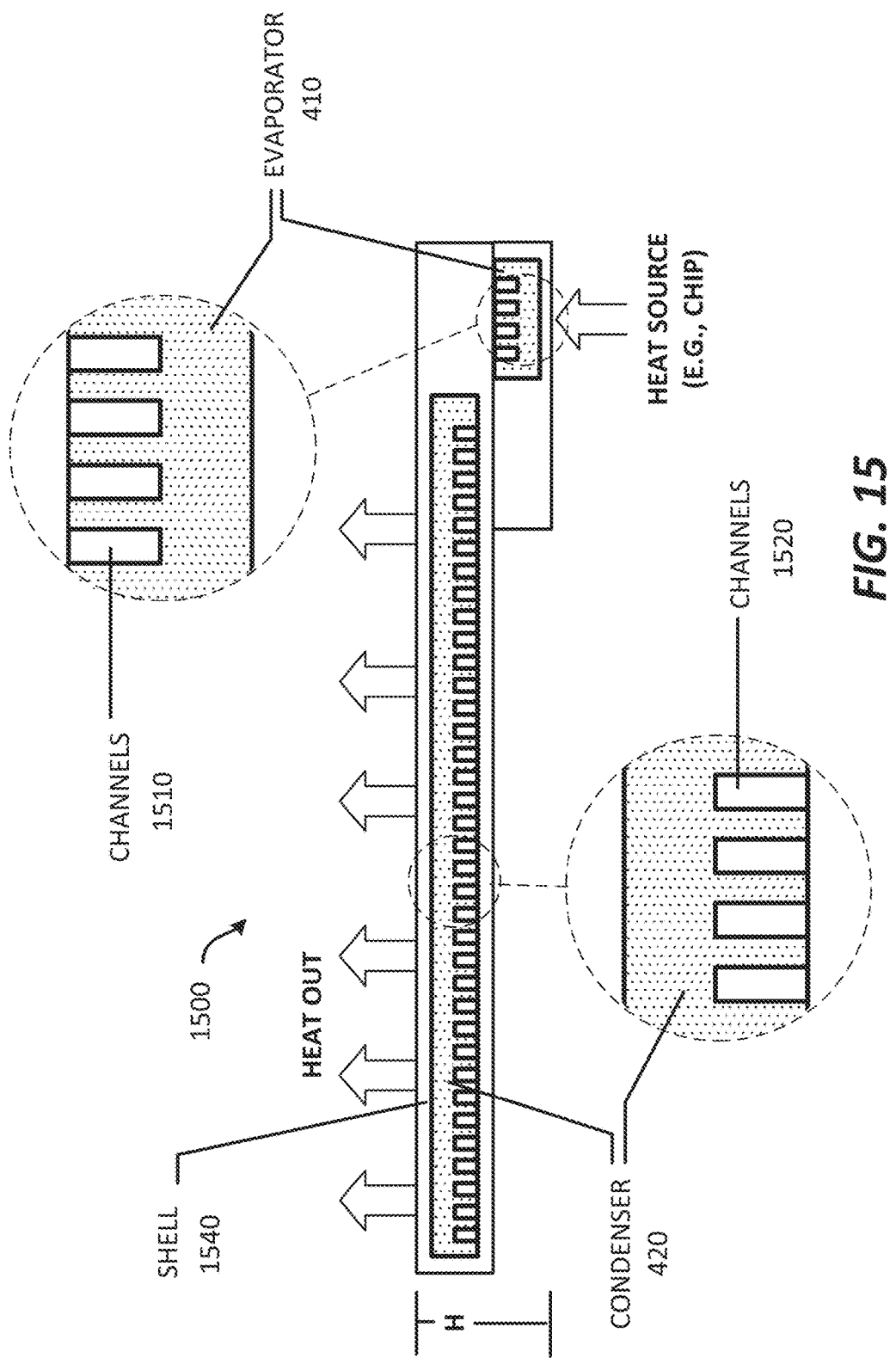
FIG. 15 illustrates a profile view of a heat dissipating device.

FIG. 15 illustrates a heat dissipating device 1500 that includes the evaporator 410 and the condenser 420. As shown in FIG. 15, the evaporator 410 includes channels 1510 (e.g., evaporator channel) in a thermally conductive element. The channels 1510 allow the fluid (e.g., fluid 470) to flow through. The channels 1510 are formed on an upper portion of the evaporator 410. The channels 1510 may be defined by a shell 1540.

The condenser 420 includes channels 1520 (e.g., condenser channels) in a thermally conductive element. The channels 1520 allow the fluid (e.g., evaporated fluid 620) to flow through. The channels 1520 are formed on a lower portion of the condenser 420. The channels 1520 may be defined by the shell 1340.

Figure 16:
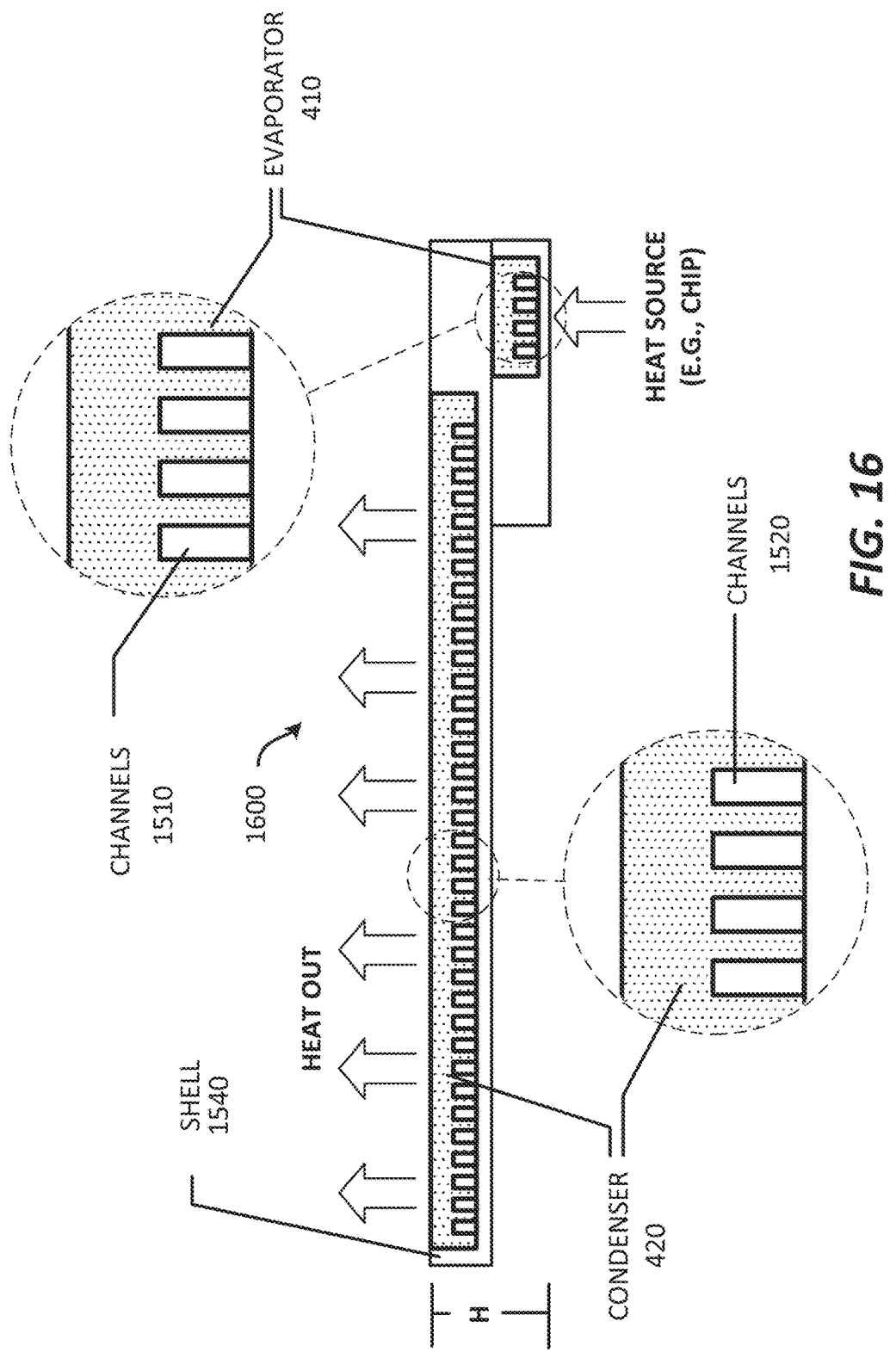
FIG. 16 illustrates a profile view of another heat dissipating device.

FIG. 16 illustrates a heat dissipating device 1600 that includes the evaporator 410 and the condenser 420. As shown in FIG. 16, the evaporator 410 includes channels 1510 (e.g., evaporator channel) in a thermally conductive element. The channels 1510 allow the fluid (e.g., fluid 470) to flow through. The channels 1510 are formed on a lower portion of the evaporator 410. The channels 1510 may be defined by the shell 1540.

The condenser 420 includes channels 1520 (e.g., condenser channels) in a thermally conductive element. The channels 1520 allow the fluid (e.g., evaporated fluid 620) to flow through. The channels 1520 are formed on a lower portion of the condenser 420. The channels 1520 may be defined by the shell 1540.

Figure 17:
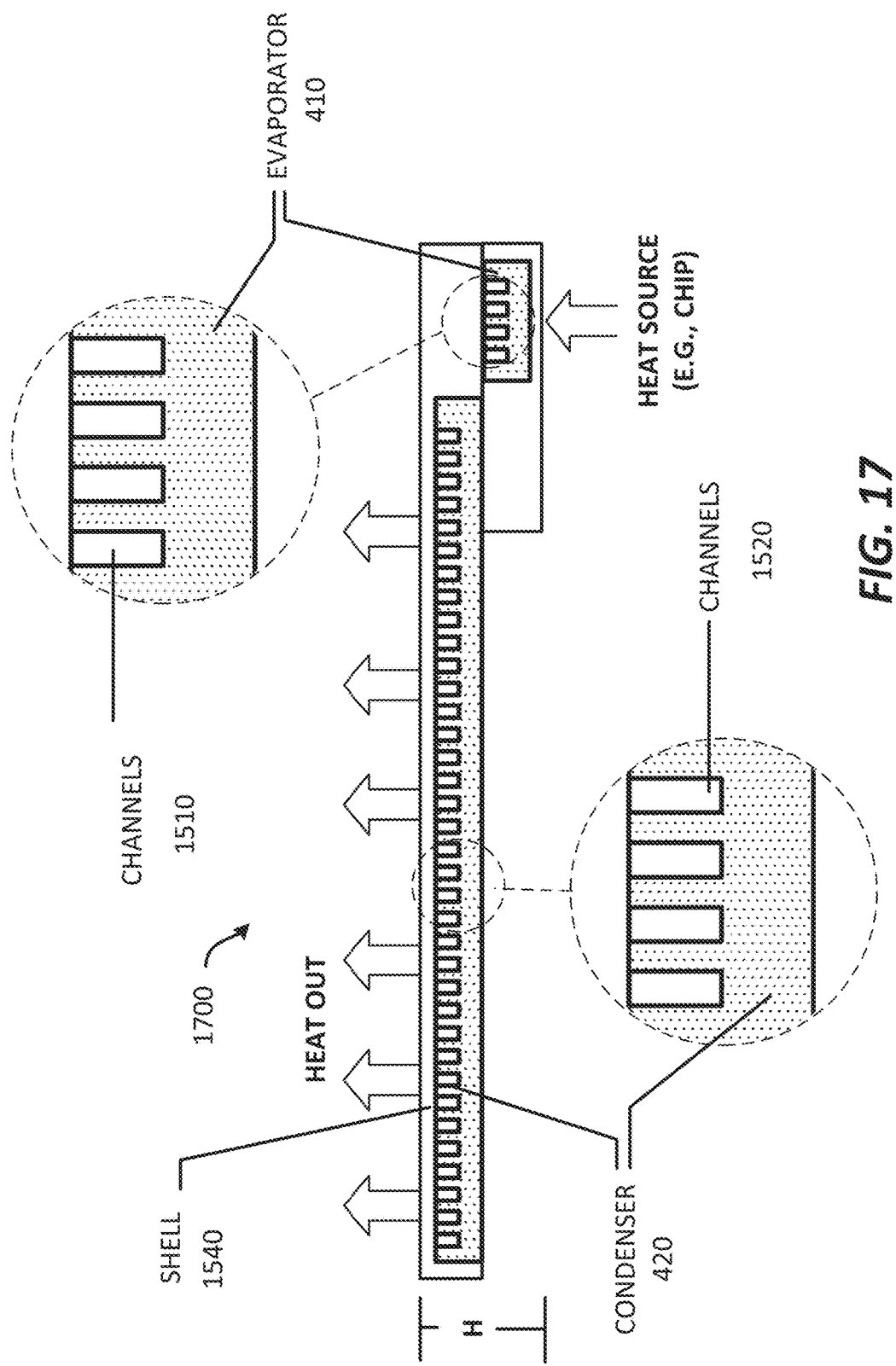
FIG. 17 illustrates a profile view of another heat dissipating device.

FIG. 17 illustrates a heat dissipating device 1700 that includes the evaporator 410 and the condenser 420. As shown in FIG. 17, the evaporator 410 includes channels 1510 (e.g., evaporator channel) in a thermally conductive element. The channels 1510 allow the fluid (e.g., fluid 470) to flow through. The channels 1510 are formed on an upper portion of the evaporator 410. The channels 1510 may be defined by the shell 1540.

The condenser 420 includes channels 1520 (e.g., condenser channels) in a thermally conductive element. The channels 1520 allow the fluid (e.g., evaporated fluid 620) to flow through. The channels 1520 are formed on an upper portion of the condenser 420. The channels 1520 may be defined by the shell 1540.

Figure 18:
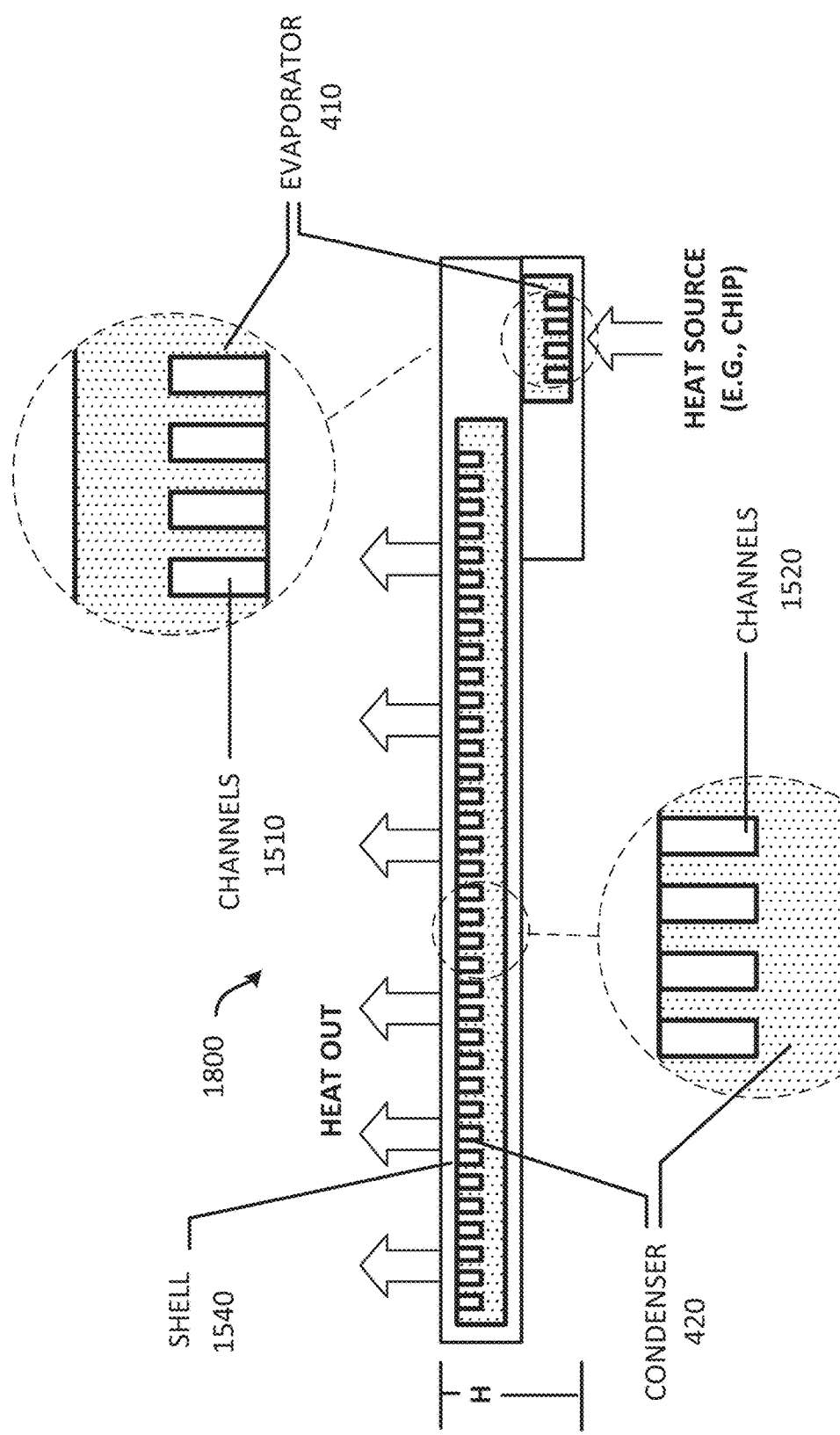
FIG. 18 illustrates a profile view of another heat dissipating device.

FIG. 18 illustrates a heat dissipating device 1800 that includes the evaporator 410 and the condenser 420. As shown in FIG. 18, the evaporator 410 includes channels 1510 (e.g., evaporator channel) in a thermally conductive element. The channels 1510 allow the fluid (e.g., fluid 470) to flow through. The channels 1510 are formed on a lower portion of the evaporator 410. The channels 1510 may be defined by the shell 1540.

The condenser 420 includes channels 1520 (e.g., condenser channels) in a thermally conductive element. The channels 1520 allow the fluid (e.g., evaporated fluid 620) to flow through. The channels 1520 are formed on an upper portion of the condenser 420. The channels 1520 may be defined by the shell 1540.

The shell 1540 may be made of the same material as the evaporator 410 and the condenser 420, the collection portion 460, the collection portion 960, the collection portion 1260, the collection portion 462, the evaporation portion 450, and/or the evaporation portion 452.

Exemplary Thermally Conductive Elements Configured as Evaporator or Condenser

Figure 19:
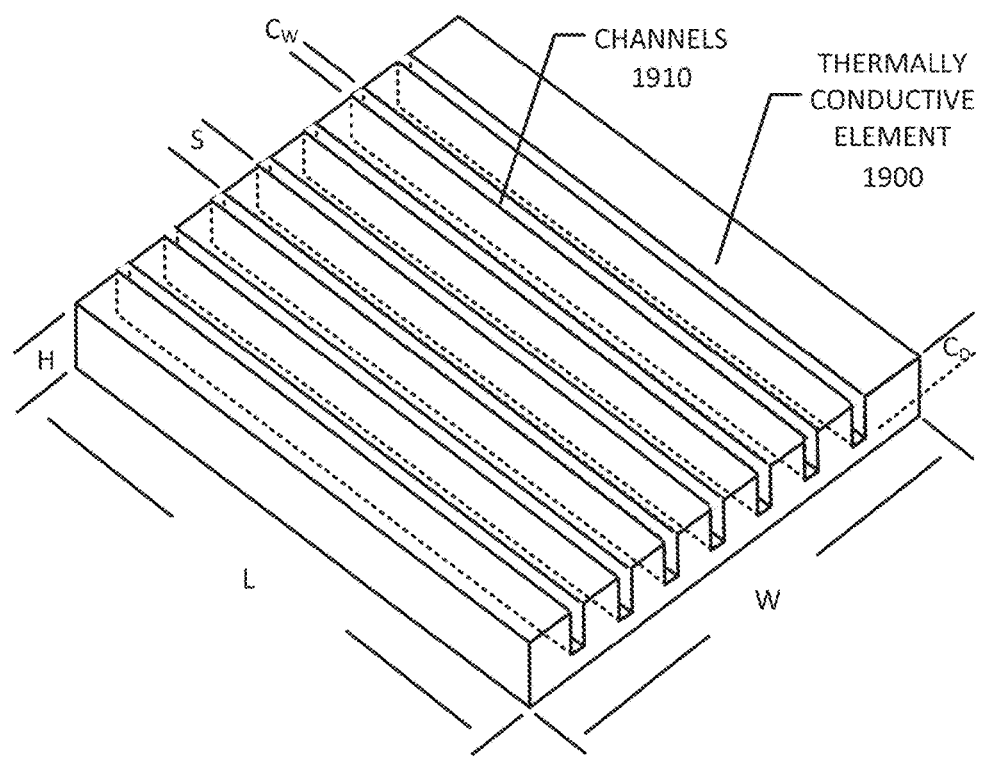
FIG. 19 illustrates an angled view of a thermally conductive element that is configured as an evaporator.
Figure 20:
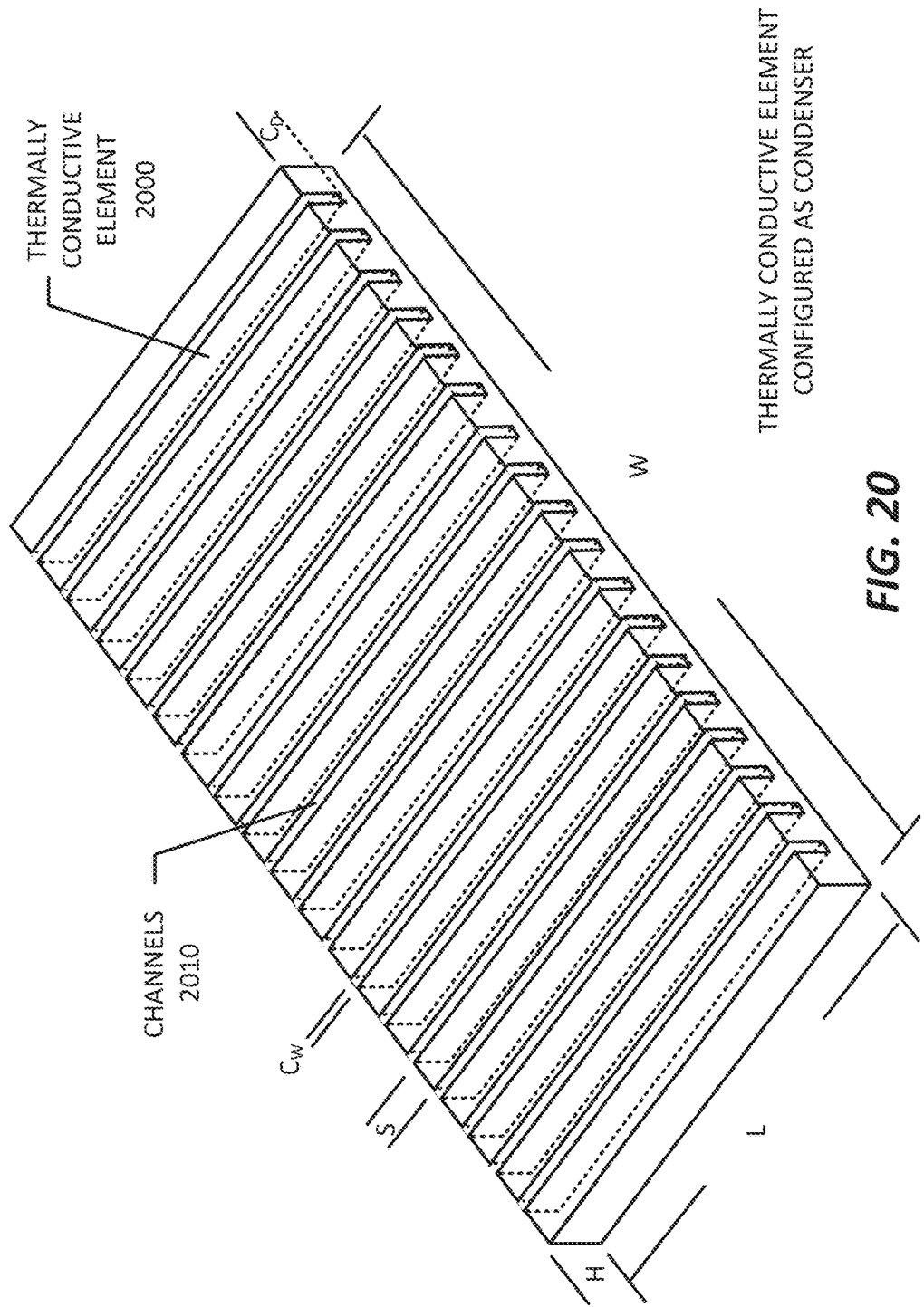
FIG. 20 illustrates an angled view of a thermally conductive element that is configured as a condenser.

FIG. 19 illustrates a thermally conductive element 1900 that can be configured to operate as an evaporator (e.g., evaporator 410) in a heat dissipating device. FIG. 20 illustrates a thermally conductive element 2000 that can be configured to operate as a condenser (e.g., condenser 420, condenser 920) in a heat dissipating device.

The thermally conductive element 1900 may be made of any of the materials described above in Table 1 and/or in other parts of the disclosure. The thermally conductive element 1900 includes a length (L), a width (W), and a height (H). The thermally conductive element 1900 includes a plurality of channels 1910 that travels along the length of the thermally conductive element 1900. One or more channels from the plurality of channels 1910 may have a width ($C_W$) and a depth ($C_D$). Two or more channels from the plurality of channels 1910 may be separated by a spacing (S).

In some implementations, when the thermally conductive element 1900 is configured to be an evaporator (e.g., evaporator 410), the thermally conductive element 1900 may measure about 20 mm (L)×15 mm (W)×450 microns (μm) (H). In some implementations, the channels 1910 of the thermally conductive element 1900 may be about 300 microns (μm) ($C_W$)×250 microns (μm) ($C_D$), when the thermally conductive element 1900 is configured as an evaporator. In some implementations, the dimensions of the channels are selected so that the pressure drop across the thermally conductive element 1900 (e.g., evaporator) is about 0.0049 bar or less.

In some implementations, when the thermally conductive element 2000 is configured to be a condenser (e.g., condenser 420), the thermally conductive element 2000 may measure about 20 mm (L)×120 mm (W)×450 microns (μm) (H). In some implementations, the channels 2010 of the thermally conductive element 2000 may be about 300 microns (μm) ($C_W$)×300 microns (μm) ($C_D$), when the thermally conductive element 2000 is configured as a condenser. In some implementations, the dimensions of the channels are selected so that the pressure drop across the thermally conductive element 2000 (e.g., condenser) is about 0.0002 bar or less.

The above dimensions are exemplary. Different implementations may use different dimensions.

Exemplary Sequence for Fabricating a Thermally Conductive Element

FIG. 21 (which includes 21A-21B) illustrates an exemplary sequence for fabricating a thermally conductive element that can be configured as an evaporator (e.g., evaporator 410) or a condenser (e.g., condenser 420, condenser 920) in a heat dissipating device. The sequence of FIG. 21 can be used to fabricate the thermally conductive element 1900 or the thermally conductive element 2000. For the purpose of simplification, the sequence of FIG. 21 will be used to describe fabricating the thermally conductive element 2000.

Figure 21A:
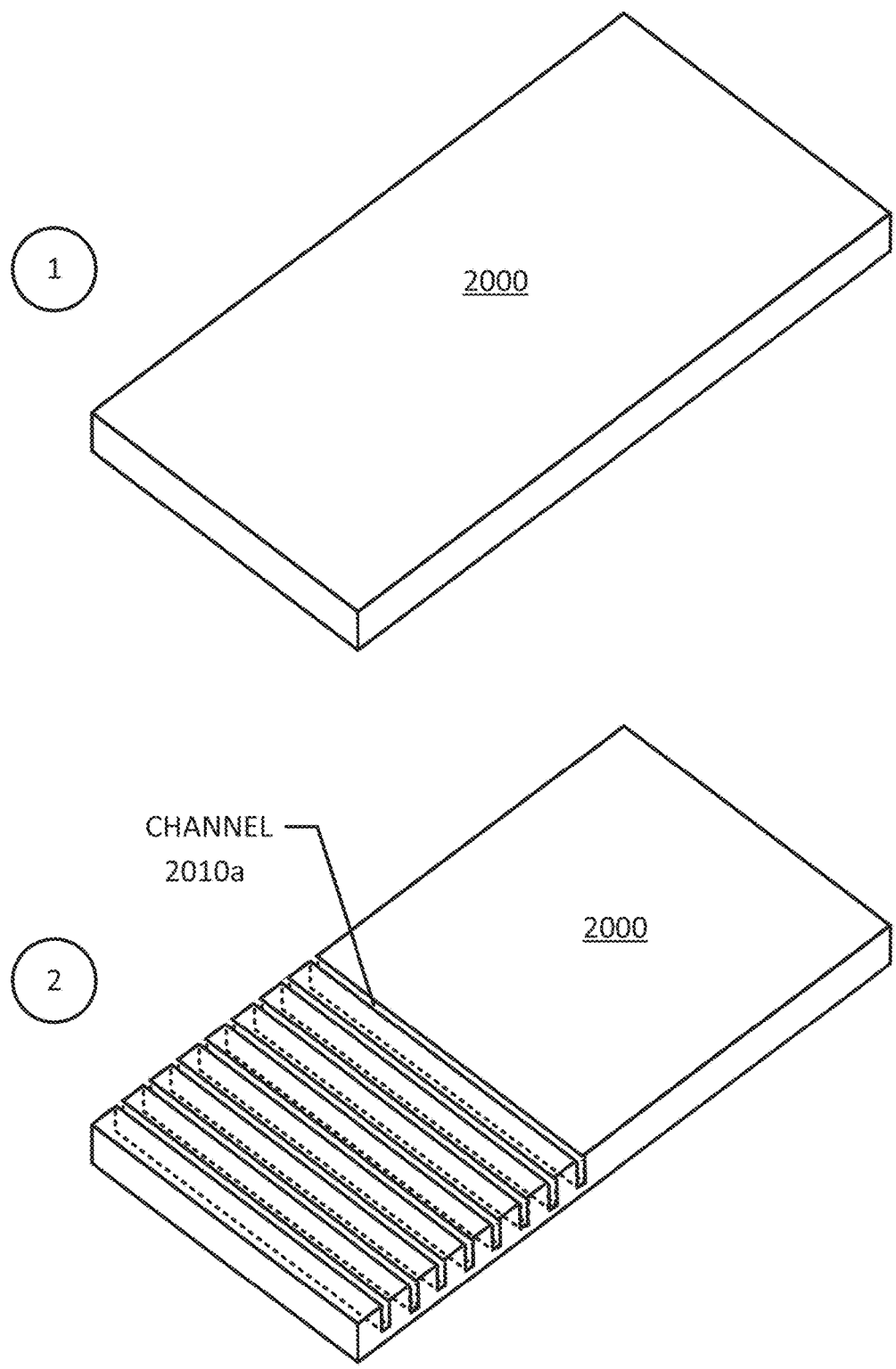
FIG. 21 (which includes FIGS. 21A-21B) illustrates a sequence for fabricating a thermally conductive element.

Stage 1 of FIG. 21A, illustrates a thermally conductive element 2000 that is provide (e.g., by a supplier) or fabricated. Different implementations may use different materials for the thermally conductive element 2000. Examples of materials for the thermally conductive element 2000 are listed in Table 1.

Stage 2 illustrates a first plurality of channels 2010a that are formed in the thermally conductive element 2000. The first plurality of channels 2010a may be micro channels that are formed by a plowing process or a micro bonding process. In some implementations, such processes can be used to form channels that have a width of about 300 microns (μm) and, a depth of about 250 microns (μm). However, different implementations may use different dimensions.

Figure 21B:
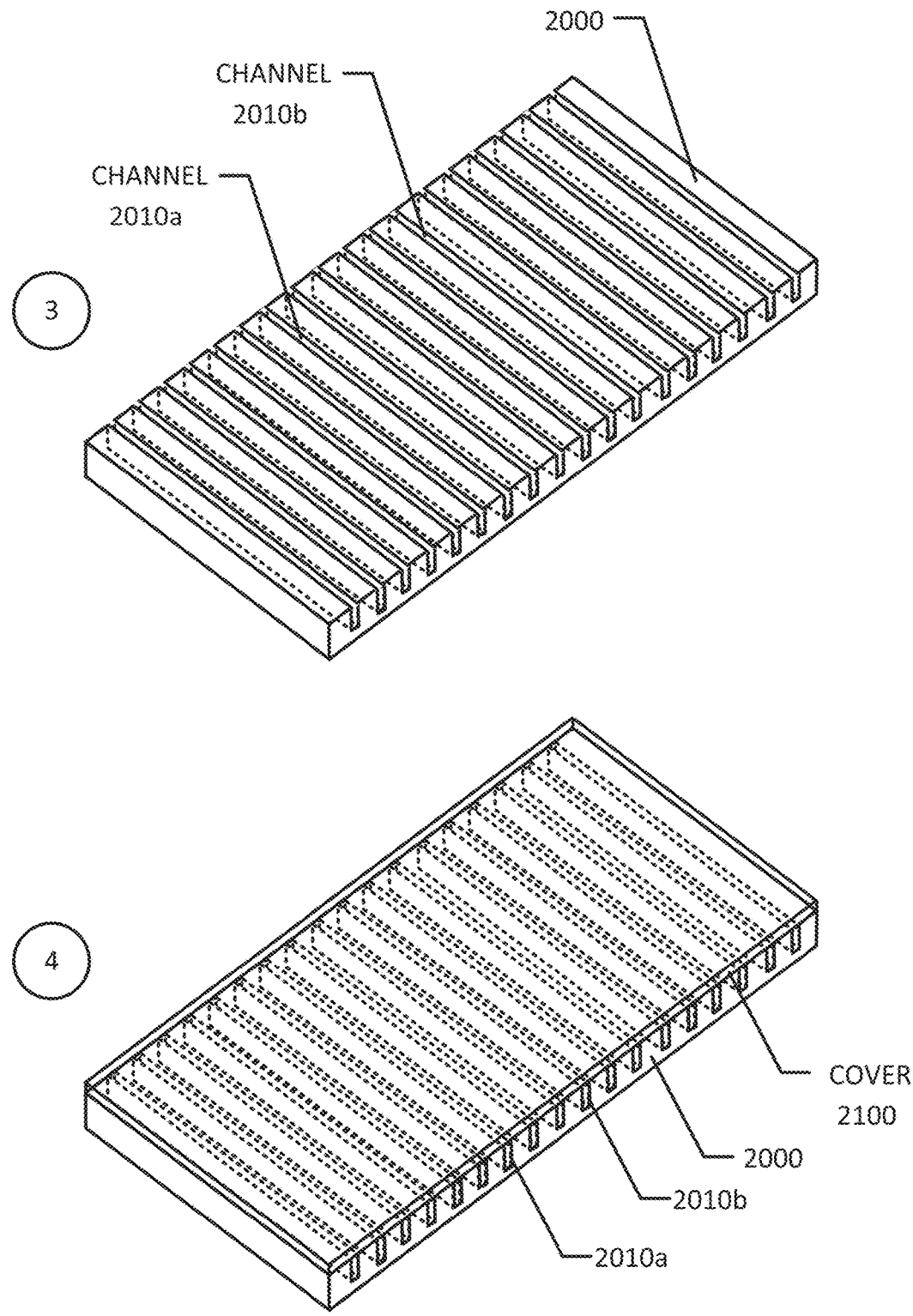

Stage 3 of FIG. 21B, illustrates a second plurality of channels 2010b that are formed in the thermally conductive element 2000. The second plurality of channels 2010b may be micro channels that are formed by a plowing process or a micro bonding process, as described above in Stage 2.

Stage 4 illustrates a cover 2100 that is optionally coupled to the thermally conductive element 2000 such the cover 2100 covers the first plurality of channels 2010a and the second plurality of channels 2010b. An adhesive or a welding process may be used to couple the cover 2100 to the thermally conductive element 2000. In some implementations, the cover 2100 may be optional. In some implementations, the cover 2100, the thermally conductive element 2000, the first plurality of channels 2010a and the second plurality of channels 2010b may be configured to operate as an evaporator (e.g., evaporator 410) or a condenser (e.g., condenser 420) for a heat dissipating device.

The cover 2100 is optional because in some implementations, a shell (e.g., shell 1540) may act as the cover for the thermally conductive element (e.g., 1900, 2000).

Exemplary Method for Fabricating a Heat Dissipating Device

Figure 22:
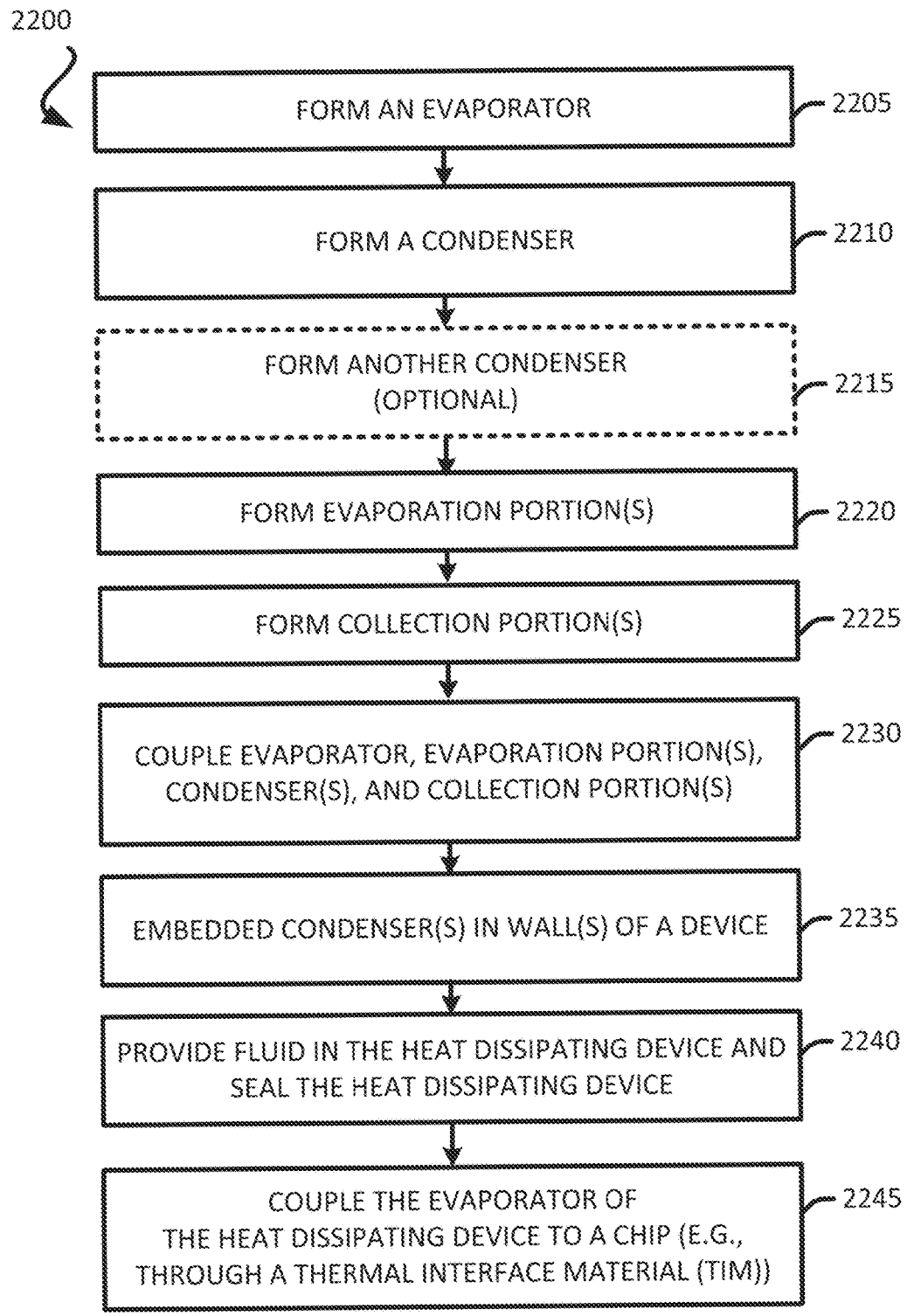
FIG. 22 illustrates an exemplary flow diagram of a method for fabricating a heat dissipating device.

FIG. 22 illustrates a flow chart of an exemplary method 2200 for fabricating a heat dissipating device and coupling the heat dissipating device to a device (e.g., mobile device). The method of FIG. 22 may be used to fabricate any of the heat dissipating devices described in the present disclosure. It is noted the order of the method may be changed and/or modified. In some implementations, some of the processes may be formed concurrently.

As shown in FIG. 22, the method forms (at 2205) an evaporator (e.g., evaporator 410). An example of forming an evaporator is illustrated in FIGS. 21A-21B.

The method forms (at 2210) a condenser (e.g., condenser 420). An example of forming a condenser is illustrated in FIGS. 21A-21B.

The method optionally forms (at 2215) another condenser (e.g., condenser 920). The additional condenser may be formed to provide higher cooling power that may be needed for extra condensation capabilities. An example of forming a condenser is illustrated in FIGS. 21A-21B.

The method forms (at 2220) at least one evaporation portion (e.g., evaporation portion 450, evaporation portion 452).

The method forms (at 2225) at least one collection portion (e.g., collection portion 460, collection portion 462).

The method couples (at 2230) the evaporator, the evaporation portion(s), the condenser(s), and the collection portion(s) to form a heat dissipating device. Different implementations may use different processes to couple the evaporator, the evaporation portion(s), the condenser(s), and the collection portion(s). In some implementations, an adhesive material may be used to couple the different components. In some implementations, a welding process may be used to couple the different components.

The method embeds (at 2235) one or more condenser in one or more walls of the device (e.g., mobile device). In some implementations, a first condenser (e.g., condenser 420) is embedded in a first wall (e.g., wall 510) of the device, and a second condenser (e.g., condenser 920) is embedded in a second wall (e.g., wall 520) of the device. The second condenser may be used for higher cooling power needing extra condensation.

The method provides (at 2240) a fluid (e.g., fluid 470) in the heat dissipating device. In some implementations, the fluid is provided through a small cavity in the heat dissipating device, and the small cavity is subsequently sealed. The cavity may be formed in the collection portion and/or the evaporation portion. However, the cavity may be formed in other parts of the heat dissipating device.

The method couples (at 2245) the heat dissipating device to an integrated device (e.g., chip, die, package) in a device (e.g., mobile device). In some implementations, the heat dissipating device is coupled to the integrated device through a thermal interface material (TIM). In some implementations, the heat dissipating device is coupled to a heat generating region of a device.

Exemplary Heat Dissipating Devices

In some implementations, the fluid inside the heat dissipating device is heated to very high pressures. High pressures can be problematic and very dangerous because it can result in the heat dissipating device cracking and/or rupturing. Thus, it is important that the heat dissipating device can withstand very internal high pressures (e.g., 16 PSI). The high pressures values will vary based on the different fluids (e.g., refrigerant) used.

Figure 23:
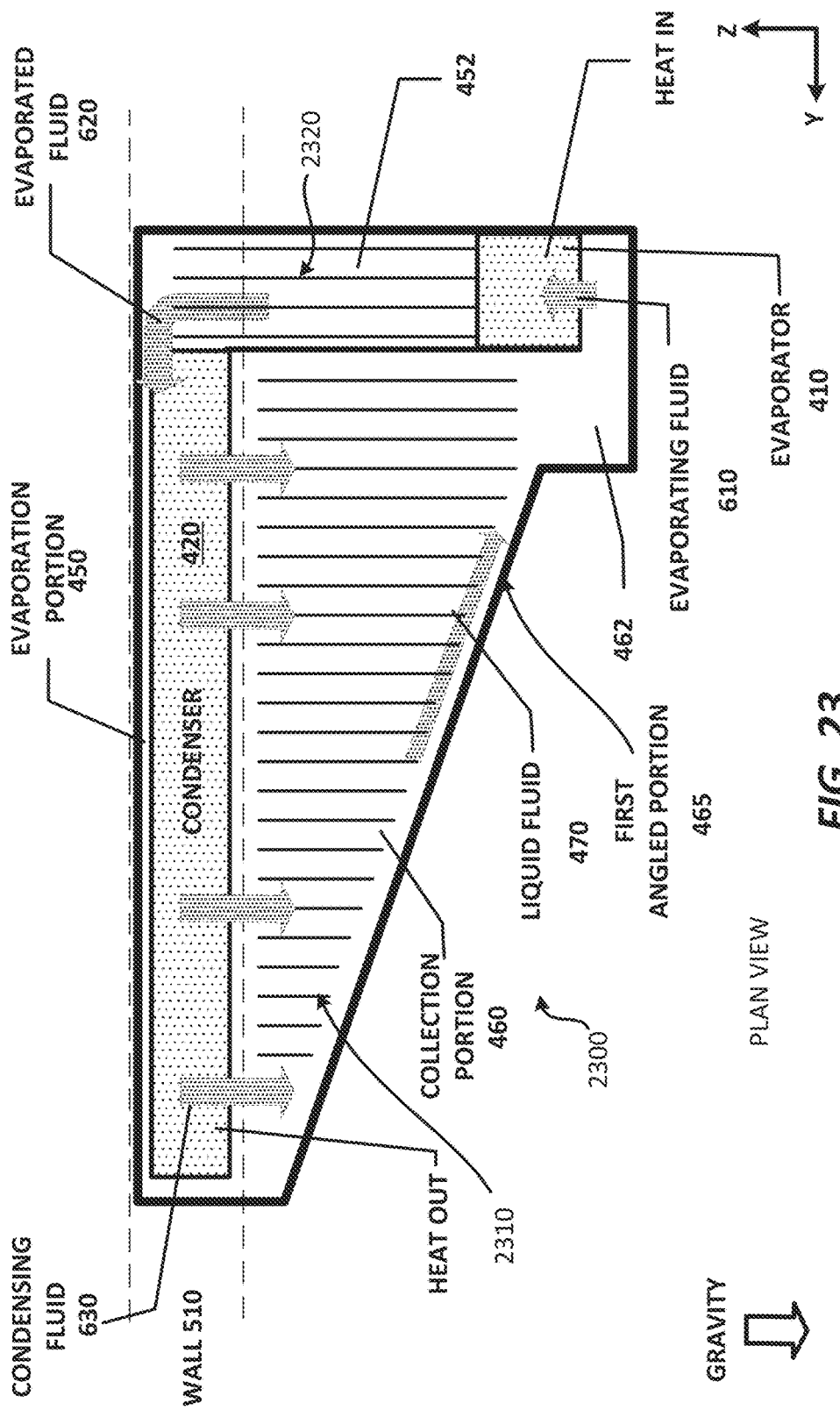
FIG. 23 illustrates a view of a heat dissipating device comprising walls for providing structural support.

FIG. 23 illustrates an example of a heat dissipating device 2300 that can withstand high internal pressures. The heat dissipating device 2300 includes components and/or structure that are configured to provide structural support for the heat dissipating device. The heat dissipating device 2300 is similar to the heat dissipating device 400 (as shown in FIG. 6), and thus includes similar components as the heat dissipating device 400. The heat dissipating device 2300 also includes one or more evaporation portion walls 2320, one or more collection portion walls 2310. The heat dissipating device 2300 operates in a similar manner as the heat dissipating device 400, but can operate at higher internal pressures. The heat dissipating device 2300 may also include a plurality of ribs (not shown) that provide additional structural support.

The one or more evaporation portion walls 2320 and/or the one or more collection portion walls 2310 are configured to provide additional coupling, thus provide additional structural support to withstand high internal pressure. In some implementations, the one or more evaporation portion walls 2320 and/or the one or more collection portion walls 2310 help provide a heat dissipating device 2300 that can withstand about 16 PSI of internal pressure inside the heat dissipating device 2300.

FIG. 23 also illustrates that the evaporation portion walls 2320 subdivide the evaporation portion 450 and/or the evaporation portion 452, and the collection portion walls 2310 subdivide the collection portion 460 and/or the collection portion 462. In some implementations, the flow of the fluid inside the heat dissipating device 2300 is similar to the flow of the fluid inside the heat dissipating device 400. The heat dissipating device 2300 may be a cooling device that provides heat dissipation through recirculation of a fluid without the need of a pump or compressor.

FIG. 23 illustrates the fluid 470 in the collection portion 460 of the heat dissipating device 2300. The collection portion 460 includes the collection portion walls 2310. The collection portion 460 has an angled portion (e.g., 465) so that the fluid 470 (which is in liquid form) flows down (e.g., due to gravity) towards the evaporator 410. The evaporator 410 is being heated by a heat generating region (e.g., region comprising a TIM and/or an integrated device).

As the fluid 470 enters the evaporator 410 and travels through the evaporator 410, the fluid 470 becomes an evaporating fluid 610 due to the heat from the evaporator 410. Once the evaporating fluid 610 exits the evaporator 410, the evaporating fluid 610 becomes an evaporated fluid 620 (e.g., vapor fluid) that travels through the evaporation portion 452 and the evaporation portion 450 (e.g., along the evaporation portion walls 2320) towards the condenser 420.

The evaporated fluid 620 may include fluid in a gas phase and some fluid in liquid phase.

As the evaporated fluid 620 (e.g., vapor fluid) enters the condenser 420 and travels through the condenser 420, the evaporated fluid 620 becomes a condensing fluid 1030. This process takes heat away from the evaporated fluid 620 and into the condenser 420. The heat from the condenser 420 escapes out of the heat dissipating device 2300. Once the condensing fluid 630 exits the condenser 420, the condensing fluid 630 returns to (e.g., via gravity) the collection portion 460 (e.g., along the collection portion walls 2310) as the fluid 470 (e.g., condensed fluid), in liquid phase, and the cycle repeats itself.

In some implementations, as long as the evaporator 410 is being heated by an external heat source or heat generating region, the fluid 470 will cycle through the heat dissipating device 2300 in a manner as described above.

In some implementations, the heat dissipating device 2300 operates optimally when the heat dissipating device 2300 is arranged such that the evaporator 410 is located lower than the condenser 420, so as to take advantage of gravity pulling the fluid 470 towards the collection portion 462 and the evaporator 410 (e.g., without the need of a pump or compressor). As mentioned above, gravity may provide the force that returns the condensed fluid to the collection portion.

It is noted that different implementations may provide a heat dissipating device with different shapes, designs and/or configurations. For example, the evaporator 410 may include one or more evaporators. Similarly, the condenser 420 may include one more condensers.

Figure 24:
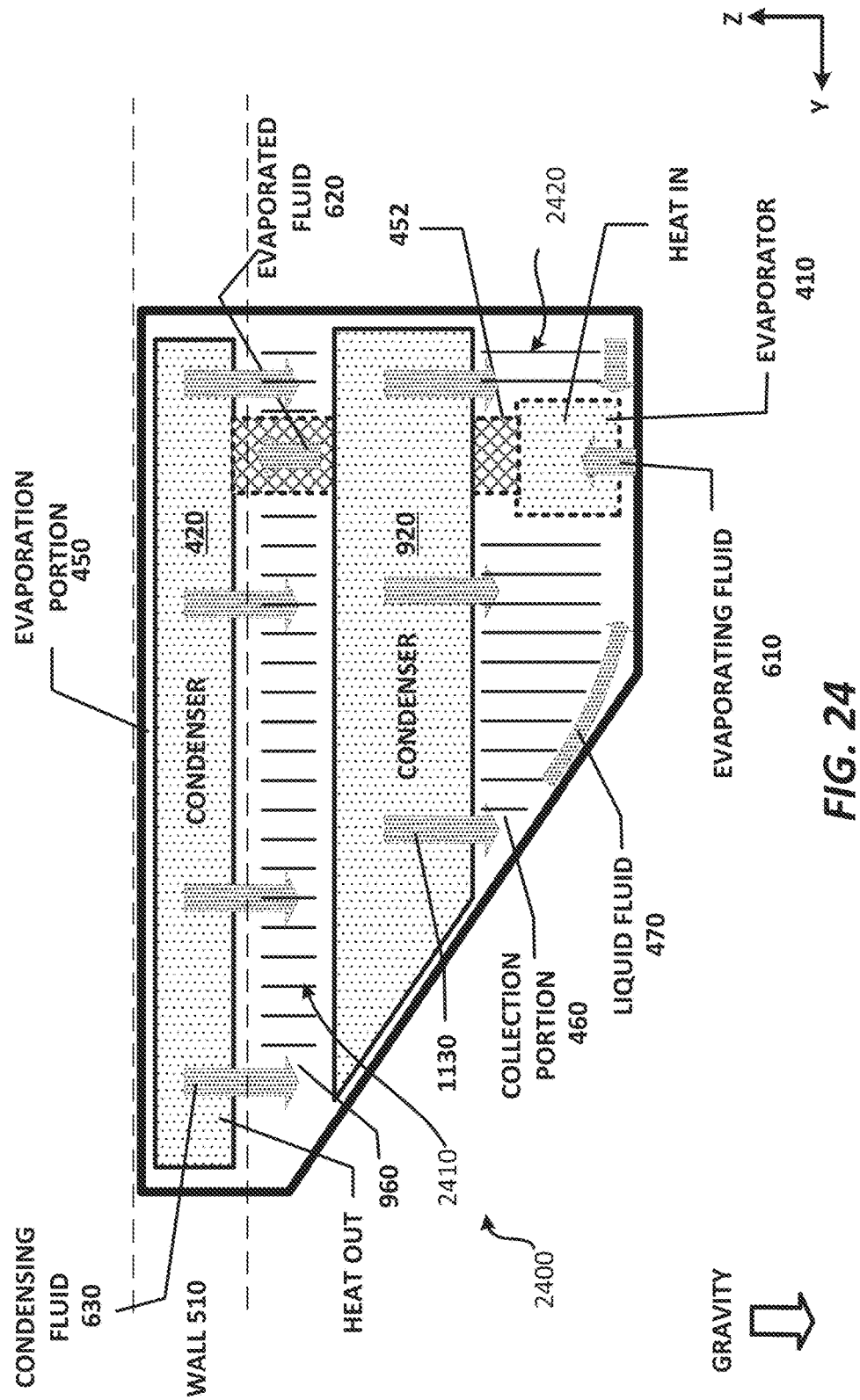
FIG. 24 illustrates a view of a heat dissipating device comprising walls for providing structural support.

FIG. 24 illustrates an example of a heat dissipating device 2400 that can withstand high internal pressures. The heat dissipating device 2400 includes components and/or structure that are configured to provide structural support for the heat dissipating device. The heat dissipating device 2400 is similar to the heat dissipating device 1200 (as shown in FIG. 12), and thus includes similar components as the heat dissipating device 1200. The heat dissipating device 2400 also includes one or more collection portion walls 2410 and 2420. The heat dissipating device 2400 operates in a similar manner as the heat dissipating device 1200, but can operate at higher internal pressures. The heat dissipating device 2400 may also include a plurality of ribs (not shown) that provide structural support. The heat dissipating device 2400 may also include one or more evaporation portion walls (not shown) for structural support. The one or more evaporation portion walls may be similar to the one or more evaporation portion walls 2320 of FIG. 23.

The one or more collection portion walls 2410 and 2420 are configured to provide additional coupling, thus provide additional structural support to withstand high internal pressure. In some implementations, the one or more collection portion walls 2410 and 2420 help provide a heat dissipating device 2400 that can withstand about 16 PSI of internal pressure inside the heat dissipating device 2400.

FIG. 24 also illustrates that the collection portion walls 2410 subdivide the collection portion 460 and/or the collection portion 462. Similarly, the evaporation portion walls subdivide the evaporation portion 450 and/or the evaporation portion 452, in a similar fashion as described in FIG. 23.

In some implementations, the flow of the fluid inside the heat dissipating device 2400 is similar to the flow of the fluid inside the heat dissipating device 1200. The heat dissipating device 2400 may be a cooling device that provides heat dissipation through recirculation of a fluid without the need of a pump or compressor.

Exemplary Electronic Devices

Figure 25:
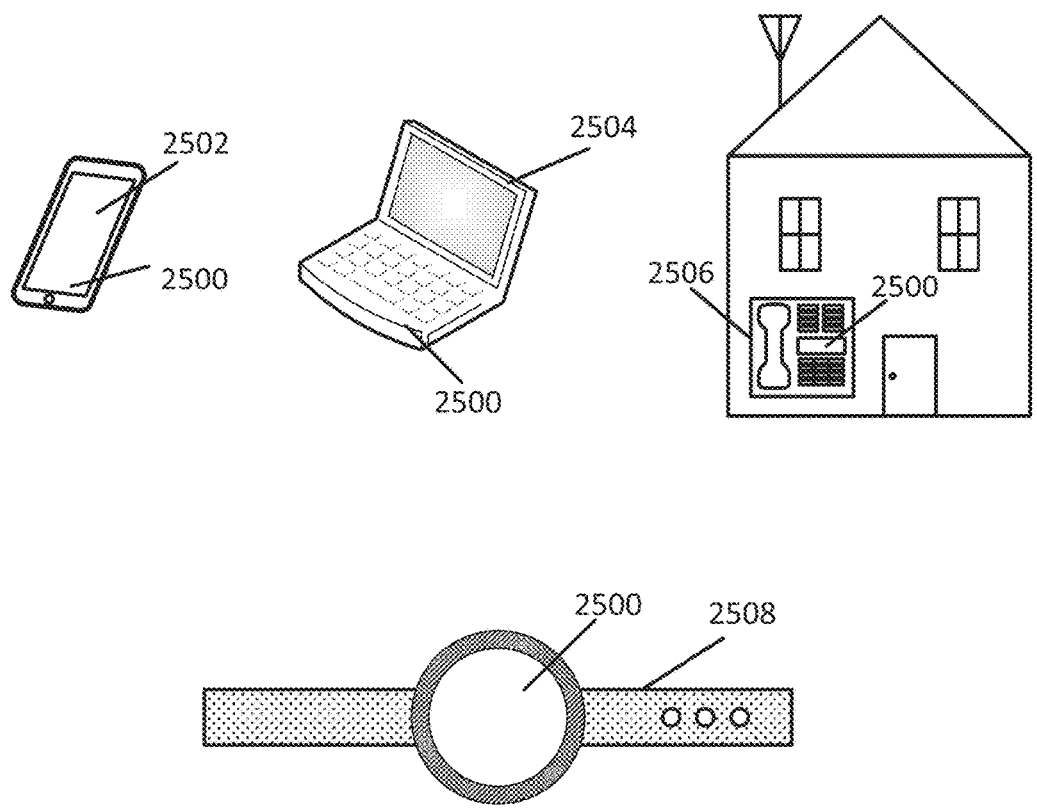
FIG. 25 illustrates various electronic devices that may integrate a heat dissipating device, a semiconductor device, an integrated device, a die, an integrated circuit, a PCB and/or a multi-layer heat spreader described herein.

FIG. 25 illustrates various electronic devices that may be integrated with any of the aforementioned heat dissipating device, integrated device, semiconductor device, integrated circuit, die, interposer, package or package-on-package (PoP). For example, a mobile phone device 2502, a laptop computer device 2504, a fixed location terminal device 2506, a wearable device 2508 may include an integrated device 2500 as described herein. The integrated device 2500 may be, for example, any of the integrated circuits, dies, integrated devices, integrated device packages, integrated circuit devices, device packages, integrated circuit (IC) packages, package-on-package devices described herein. The devices 2502, 2504, 2506, 2508 illustrated in FIG. 25 are merely exemplary. Other electronic devices may also feature the integrated device 2500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 4, 5, 6, 7, 8, 9, 10, 11, 12, 13, 14, 15, 16, 17, 18, 19, 20, 21A-21B, 22, 23, 24 and/or 25 may be rearranged and/or combined into a single component, process, feature or function or embodied in several components, processes, or functions. Additional elements, components, processes, and/or functions may also be added without departing from the disclosure. It should also be noted that FIGS. 4, 5, 6, 7, 8, 9, 10, 11, 12, 13, 14, 15, 16, 17, 18, 19, 20, 21A-21B, 22, 23, 24 and/or 25 and its corresponding description in the present disclosure is not limited to dies and/or ICs. In some implementations, FIGS. 4, 5, 6, 7, 8, 9, 10, 11, 12, 13, 14, 15, 16, 17, 18, 19, 20, 21A-21B, 22, 23, 24 and/or 25 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
a region comprising an integrated device; and
a heat dissipating device coupled to the region comprising the integrated device, the heat dissipating device implemented in at least a first wall of the device, the heat dissipating device configured to dissipate heat away from the region, wherein the heat dissipating device comprises:
a fluid;
an evaporator configured to evaporate the fluid;
a first condenser configured to condense the fluid, wherein the first condenser is located in the first wall of the device;
an evaporation portion coupled to the evaporator and the first condenser, the evaporation portion configured to channel an evaporated fluid from the evaporator to the first condenser; and
a collection portion coupled to the first condenser and the evaporator, the collection portion configured to channel a condensed fluid from the first condenser to the evaporator, wherein the collection portion is located in at least another wall of the device.

2. The device of claim 1, wherein the heat dissipating device further comprises a second condenser configured to condense the fluid.

3. The device of claim 2, wherein the second condenser is located in a second wall of the device.

4. The device of claim 1, wherein the collection portion comprises at least one non-orthogonal angled portion, the at least one non-orthogonal angled portion configured to direct, with the help of gravity, the condensed fluid towards the evaporator.

5. The device of claim 1, wherein the region further comprises a thermal interface material (TIM) coupled to the integrated device and the heat dissipating device.

6. The device of claim 1, wherein the heat dissipating device further comprises a plurality of walls in the evaporation portion and the collection portion, wherein the heat dissipating device is configured to withstand about 16 PSI of internal pressure.

7. The device of claim 1, wherein the evaporator comprises a plurality of channels configured to allow the fluid to pass through the evaporator such that the fluid pressure drop across the evaporator is about 0.0049 bar or less.

8. The device of claim 1, wherein the first condenser comprises a plurality of channels configured to allow the fluid to pass through the first condenser such that the fluid pressure drop across the first condenser is about 0.0002 bar or less.

9. The device of claim 1, wherein the evaporator comprises a maximum heat transfer coefficient of about 32.8 kW/m$^2$k and, wherein the first condenser comprises a maximum heat transfer coefficient of about 9.27 kW/m$^2$k.

10. The device of claim 1, wherein the integrated device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

11. An apparatus comprising:
a region comprising an integrated device; and
a heat dissipating means coupled to the region comprising the integrated device, the heat dissipating means implemented in at least a first wall of the apparatus, the heat dissipating means is configured to dissipate heat away from the region, wherein the heat dissipating means comprises:
a fluid;
an evaporator means configured to evaporate the fluid;
a first condenser means configured to condense the fluid, wherein the first condenser means is located in the first wall of the apparatus;
an evaporation portion coupled to the evaporator means and the first condenser means, the evaporation portion configured to channel an evaporated fluid from the evaporator means to the first condenser means; and
a collection portion coupled to the first condenser means and the evaporator means, the collection portion configured to channel a condensed fluid from the first condenser means to the evaporator means, wherein the collection portion is located in at least another wall of the apparatus.

12. The apparatus of claim 11, wherein the heat dissipating means further comprises a second condenser means configured to condense the fluid.

13. The apparatus of claim 12, wherein the second condenser means is located in a second wall of the device.

14. The apparatus of claim 11, wherein the collection portion comprises at least one non-orthogonal angled portion, the at least one non-orthogonal angled portion configured to direct, with the help of gravity, the condensed fluid towards the evaporator means.

15. The apparatus of claim 11, wherein the region further comprises a thermal interface material (TIM) coupled to the integrated device and the heat dissipating means.

16. The apparatus of claim 11, wherein the evaporator means comprises a plurality of channels configured to allow the fluid to pass through the evaporator means such that the fluid pressure drop across the evaporator means is about 0.0049 bar or less.

17. The apparatus of claim 11, wherein the first condenser means comprises a plurality of channels configured to allow the fluid to pass through the first condenser means such that the fluid pressure drop across the first condenser means is about 0.0002 bar or less.

18. The apparatus of claim 11, wherein the evaporator means comprises a maximum heat transfer coefficient of about 32.8 kW/m$^2$k and, wherein the first condenser means comprises a maximum heat transfer coefficient of about 9.27 kW/m$^2$k.

19. The apparatus of claim 11, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

20. The device of claim 1, wherein the heat dissipating device has dimensions of about 135 mm (L)×65 mm (W)× 0.6 mm (H), or less.

21. The device of claim 20, wherein heat dissipating device is configured to dissipate up to 18 Watts of heat.

22. The apparatus of claim 11, wherein the heat dissipating means has dimensions of about 135 mm (L)×65 mm (W)×0.6 mm (H), or less.

23. The apparatus of claim 22, wherein heat dissipating means is configured to dissipate up to 18 Watts of heat.

* * * * *